US012666678B2

(12) United States Patent
Xie et al.

(10) Patent No.: US 12,666,678 B2
(45) Date of Patent: Jun. 23, 2026

(54) STACKED TRANSISTOR BACKSIDE CONTACT FORMATION

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Christopher J. Penny, Saratoga Springs, NY (US); Hosadurga Shobha, Niskayuna, NY (US); Koichi Motoyama, Clifton Park, NY (US); John Christopher Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 18/527,595

(22) Filed: Dec. 4, 2023

(65) Prior Publication Data

US 2025/0185331 A1 Jun. 5, 2025

(51) Int. Cl.
| | |
|---|---|
| *H10D 64/01* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC ......... *H10D 64/017* (2025.01); *H10D 30/014* (2025.01); *H10D 30/43* (2025.01);
(Continued)

(58) Field of Classification Search
CPC .... H10D 64/017; H10D 30/014; H10D 30/43; H10D 30/6735; H10D 30/6757;
(Continued)

(56) References Cited

U.S. PATENT DOCUMENTS

| | | | |
|---|---|---|---|
| 6,943,067 | B2 | 9/2005 | Greenlaw |
| 10,192,819 | B1 | 1/2019 | Chanemougame |

(Continued)

FOREIGN PATENT DOCUMENTS

EP 4380329 A1 * 6/2024 ......... H10D 30/0318

*Primary Examiner* — Tuyen K Vo
(74) *Attorney, Agent, or Firm* — Seed Intellectual Property Law Group LLP

(57) ABSTRACT

A semiconductor IC structure includes a dielectric contact liner between an upper S/D region backside contact and a lower S/D region. As a result of the dielectric contact liner, the overlap between the upper transistor and the lower transistor may be increased, which may lead to further device scaling. To achieve these benefits, material that later forms the dielectric contact liner is deposited within an associated upper S/D region backside contact opening and has etch selectivity that may result in a later self-aligned reformation of the backside contact opening with reduced risk of that opening extending into the neighboring lower S/D region. The ability to self-align the formation of the backside contact opening may allow for the placement of such opening to be relatively closer to lower S/D region. The dielectric contact liner material may remain between and adequately electrically isolate the backside contact and the lower S/D region.

20 Claims, 21 Drawing Sheets

(52) U.S. Cl.
CPC ..... *H10D 30/6735* (2025.01); *H10D 30/6757*
(2025.01); *H10D 62/121* (2025.01); *H10D*
*84/0167* (2025.01); *H10D 84/017* (2025.01);
*H10D 84/0186* (2025.01); *H10D 84/038*
(2025.01); *H10D 84/85* (2025.01)

(58) Field of Classification Search
CPC ............ H10D 62/121; H10D 84/0167; H10D
84/017; H10D 84/0186; H10D 84/038;
H10D 84/85; H10D 62/151; H10D 84/83;
H10D 88/00; H10D 88/01; H10D
84/0149
See application file for complete search history.

(56) References Cited

U.S. PATENT DOCUMENTS

| | | | |
|---|---|---|---|
| 10,192,867 B1 | 1/2019 | Frougier | |
| 10,510,622 B1 | 12/2019 | Frougier | |
| 11,328,951 B2 | 5/2022 | Morrow | |
| 11,349,027 B2 | 5/2022 | Liaw | |
| 12,543,352 B2 * | 2/2026 | Chang | H10D 62/121 |
| 2011/0079836 A1 * | 4/2011 | Lin | H10B 12/053 |
| | | | 257/306 |
| 2015/0021677 A1 * | 1/2015 | Ting | H10D 64/027 |
| | | | 257/296 |
| 2019/0067091 A1 | 2/2019 | Morrow | |
| 2020/0044023 A1 * | 2/2020 | Reznicek | H10D 62/121 |
| 2020/0294998 A1 * | 9/2020 | Lilak | H10D 84/0149 |
| 2021/0202697 A1 * | 7/2021 | Young | H10D 62/121 |
| 2022/0406715 A1 | 12/2022 | Xie | |
| 2023/0178553 A1 | 6/2023 | Xie | |
| 2023/0180456 A1 * | 6/2023 | Jeong | H10B 12/05 |
| | | | 257/296 |
| 2023/0197830 A1 | 6/2023 | Chan | |
| 2023/0260971 A1 | 8/2023 | Mochizuki | |
| 2024/0196586 A1 * | 6/2024 | Anderson | H10B 10/125 |
| 2024/0321991 A1 * | 9/2024 | Hwang | H10D 64/017 |
| 2024/0413165 A1 * | 12/2024 | Zheng | H10D 30/67 |
| 2025/0098277 A1 * | 3/2025 | Liu | H10D 84/851 |

* cited by examiner

300

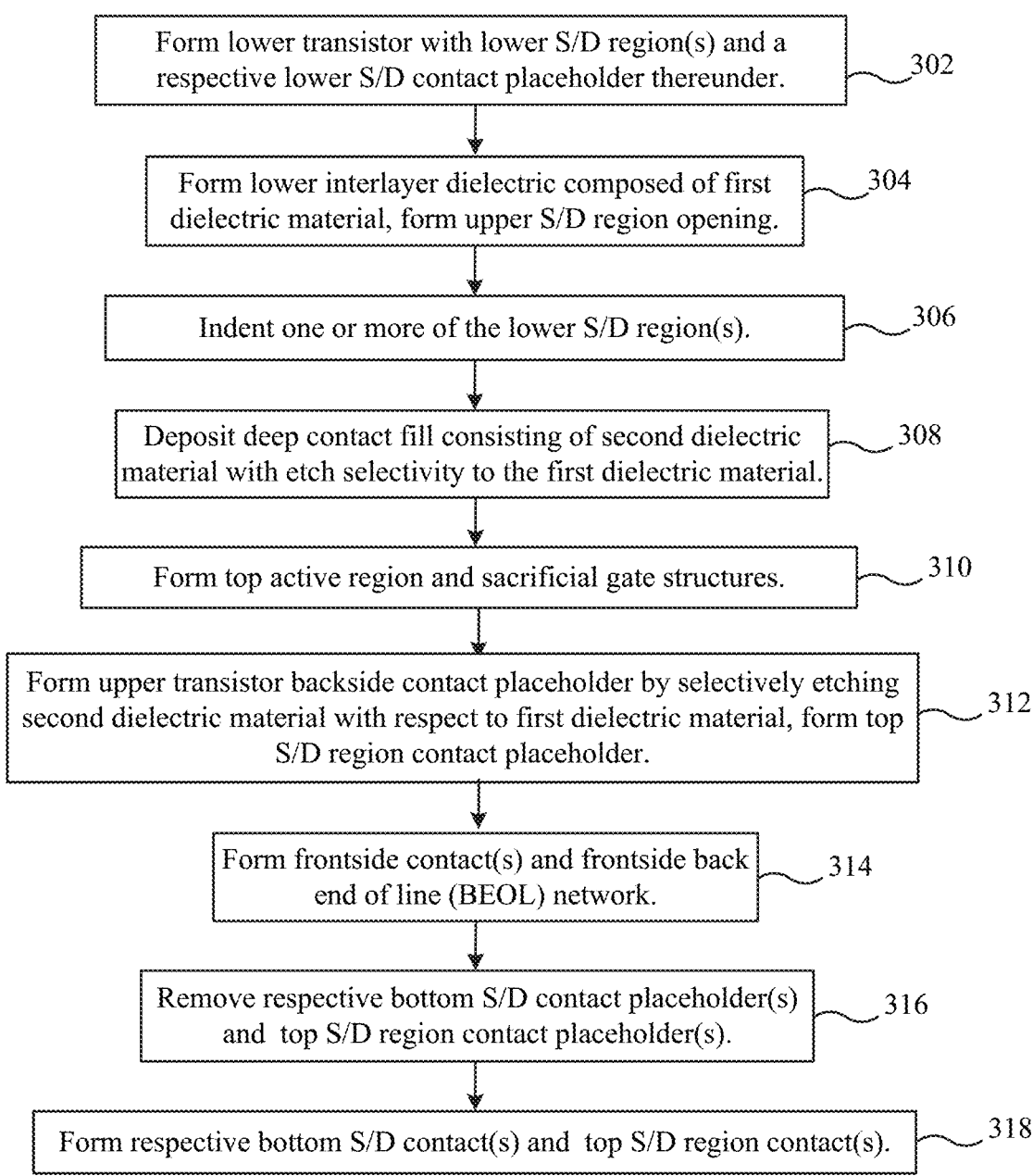

Form lower transistor with lower S/D region(s) and a respective lower S/D contact placeholder thereunder. — 302

Form lower interlayer dielectric composed of first dielectric material, form upper S/D region opening. — 304

Indent one or more of the lower S/D region(s). — 306

Deposit deep contact fill consisting of second dielectric material with etch selectivity to the first dielectric material. — 308

Form top active region and sacrificial gate structures. — 310

Form upper transistor backside contact placeholder by selectively etching second dielectric material with respect to first dielectric material, form top S/D region contact placeholder. — 312

Form frontside contact(s) and frontside back end of line (BEOL) network. — 314

Remove respective bottom S/D contact placeholder(s) and top S/D region contact placeholder(s). — 316

Form respective bottom S/D contact(s) and top S/D region contact(s). — 318

FIG. 18

STACKED TRANSISTOR BACKSIDE CONTACT FORMATION

BACKGROUND

The embodiments of the present disclosure relate to fabrication methods and resulting structures for semiconductor devices.

A backside back-end-of-line (BEOL) network, such as a backside power distribution network (BSPDN) may include signal wires for signal routing and power wires for providing power potential (e.g., VDD, VSS, etc.). The backside BEOL network may allow for the distribution of power wires and signal wires between both the frontside and backside of the semiconductor integrated circuit (IC) device. The backside BEOL network may further allow for the full or partial decoupling of signal routing and/or power routing and/or allows dividing or splitting power wires and/or signal wires between both the frontside and backside of the semiconductor IC device. By incorporating the backside BEOL network, routing congestion may be reduced, which may lead to further semiconductor IC device scaling. For example, semiconductor IC devices that incorporate a backside BEOL network can result in a 30% area reduction and improved current-resistance (IR) drop compared to typical semiconductor IC devices that include solely a frontside BEOL network.

However, the backside BEOL network may be difficult to manufacture as it requires multi-layer components to connect the backside wires with respective active regions included in the semiconductor IC device. Particularly, there are fabrication difficulties in connecting respective backside contacts to an upper transistor region (e.g., an upper source/drain region) of an upper transistor and/or to a lower transistor region (e.g., a lower source/drain region) of a lower transistor of a stacked transistor.

SUMMARY

In an embodiment of the disclosure, a semiconductor integrated circuit (IC) device is presented. The semiconductor IC device includes an upper transistor that includes an upper source/drain (S/D) region that is connected to a backside contact. The semiconductor IC device further includes a lower transistor that includes a lower S/D region with a recessed sidewall. The semiconductor IC device further includes a dielectric contact liner in direct contact with the recessed sidewall of the lower S/D region and with a sidewall of the backside contact.

In an embodiment of the disclosure, another semiconductor integrated circuit (IC) device is presented. The semiconductor IC device includes an upper transistor comprising an upper source/drain (S/D) region that is connected to a first backside contact. The semiconductor IC device further includes a lower transistor comprising a lower S/D region that has a recessed sidewall and is connected to a second backside contact. The semiconductor IC device further includes a dielectric contact liner in direct contact with the recessed sidewall of the lower S/D region and with a sidewall of the first backside contact. The semiconductor IC device is further arranged such that at least a portion of the upper S/D region overlaps the lower S/D region there below.

In an embodiment of the disclosure, a method of fabricating a semiconductor integrated circuit (IC) device is presented. The method includes forming a lower source/drain (S/D) region of a lower transistor. The method further includes depositing an interlayer dielectric (ILD) composed of a first dielectric material around the lower S/D region. The method further includes forming an upper S/D region backside contact opening within the ILD so that the upper S/D region backside contact opening exposes a side portion of the lower S/D region. The method further includes recessing the side portion of the lower S/D region. The method further includes forming an upper S/D region backside contact placeholder within the upper S/D region backside contact opening against the recessed side portion of the lower S/D region.

The above summary is not intended to describe each illustrated embodiment or every implementation or example of the present disclosure.

BRIEF DESCRIPTION OF THE DRAWINGS

The drawings included in the disclosure are incorporated into, and form part of, the specification. They illustrate embodiments of the present disclosure and, along with the description, explain the principles of the disclosure. The drawings are only illustrative of certain embodiments and do not limit the disclosure.

FIG. 18 depicts a method of fabricating a semiconductor IC device that includes a backside contact that is electrically connected with a region of an upper transistor and that may further be electrically connected to a backside BEOL network, according to one or more embodiments of the disclosure.

DETAILED DESCRIPTION

Figure 1:
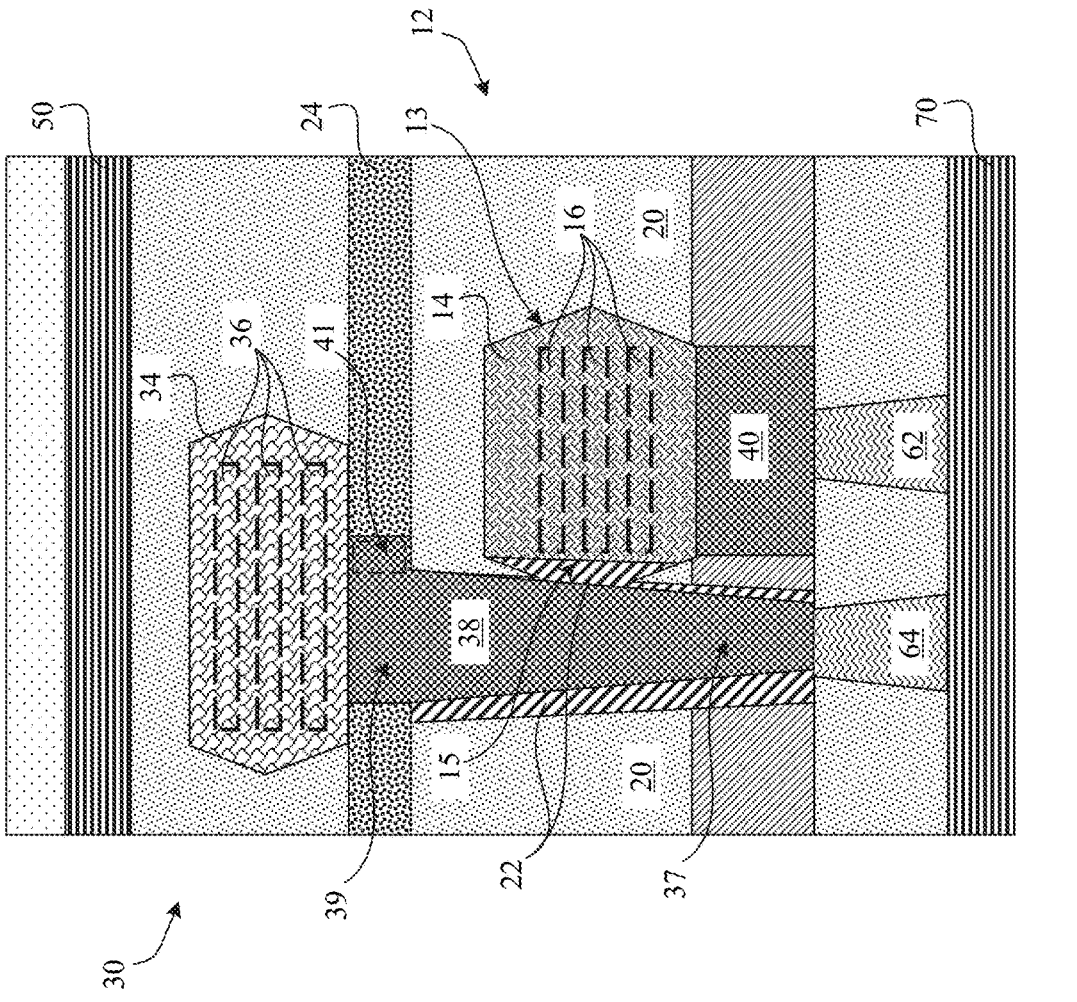
FIG. 1 depicts a cross-section view of a semiconductor IC device that includes a backside contact that is electrically connected with a region of an upper transistor and that may further be electrically connected to a backside back end of line (BEOL) network, according to one or more embodiments of the disclosure.

The present disclosure relates to fabrication methods and resulting semiconductor integrated circuit (IC) devices that include a backside contact that is electrically connected to a region, such as a source/drain (S/D) region of an upper transistor that is a part of a stacked transistor. Due to the desire for continued device scaling, overlap between the upper transistor and the lower transistor (e.g., the degree to which the respective active region perimeters of the upper transistor and the lower transistor are horizontally offset) continues to shrink. This smaller overlap increases the challenge of integrating a backside contact with a region of the upper transistor, due to the increased propensity of the backside contact shorting with one or more of the transistor regions of the lower transistor.

The embodiments of the present disclosure recognize the potential benefits of semiconductor IC device fabrication techniques that allow for a backside contact to connect against a transistor region, such as a S/D region, of an upper transistor of a stacked transistor. To achieve these and potential other benefits, a semiconductor IC device is presented that includes a stacked transistor that includes an upper transistor vertically stacked over a lower transistor. The upper transistor includes an upper transistor region, such as an upper source/drain (S/D) region. The semiconductor IC device further includes a backside contact that is connected to the upper transistor region. At least a portion of a sidewall of the backside contact is covered by a dielectric contact liner.

In an example, the lower transistor includes a lower transistor region, such as a lower S/D region. The lower transistor region may include a recessed sidewall that faces the backside contact. The dielectric contact liner may be directly between the sidewall of the backside contact of the recessed sidewall of the lower transistor region. One or more other sidewalls of lower transistor region may directly contact a lower interlayer dielectric (ILD) that consists of a dielectric material that is different from the dielectric material of the dielectric contact liner. For example, the dielectric material of the contact liner has etch selectivity with respect to the dielectric of the lower ILD.

In an example, the backside contact includes an upper portion and a lower portion. The lower portion of the backside contact may include the portion of the sidewall of the backside contact that is covered by a dielectric contact liner. The upper portion of the backside contact may have a larger perimeter, circumference, diameter, or the like, relative to the largest perimeter, circumference, diameter, or the like of the lower portion of the backside contact. In an example, the upper portion of the backside contact is horizontally surrounded by a bonding dielectric.

A transistor is a type of microdevice that may be fabricated in semiconductor IC device front-end-of-line (FEOL) fabrication operations. Conventional transistors, or the like, incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes. A FET generally is a transistor in which output current, i.e., source-drain current, is controlled by a voltage applied to an associated gate. A FET typically has three terminals, i.e., a gate structure, a source region, and a drain region. A gate structure is a structure used to control output current (i.e., flow of carriers in the channel) of a semiconducting device through electrical or magnetic fields. A channel is the region of the FET underlying the gate structure and between the source and drain of the semiconductor IC device that becomes conductive when the semiconductor device is turned on. The source is a doped region in the semiconductor IC device, in which majority carriers are flowing into the channel. A drain is a doped region in the semiconductor IC device located at the end of the channel, in which carriers are flowing out of the transistor through the drain.

One technology change modified the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanolayers, nanosheets, or the like, that are isolated from the substrate. In the GAA FET, channel surfaces are in respective contact with the source and drain and other respective channel surfaces are in contact with and surrounded by the gate.

The flowcharts and cross-sectional diagrams in the drawings illustrate a method of fabricating semiconductor IC device, such as a processor, FPGA, memory module, or the like. In some alternative implementations, the fabrication steps may occur in a different order than that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" if the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the depicted structure(s) as oriented. The terms "overlying,"

"atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all the points of both of the surfaces. Accordingly, two surfaces may be referred to as substantially coplanar despite deviations from coplanarity, so long as those deviations do not impact the desired result of the coplanarity.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor devices are well known and so, in the interest of brevity, many conventional steps will only be mentioned briefly herein or will be omitted entirely without providing the well-known process details.

In general, the various processes used to form a semiconductor IC device that may be packaged into an IC package fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of a FET is related to the electrical conductivity of the channel material. If the channel material has a relatively high conductivity, the FET can be made with a correspondingly smaller wafer footprint. A method of increasing channel conductivity and decreasing FET size is to form the channel as a nanostructure, such as a nano wire, nano ribbon, nanolayer, nanosheet, or the like, hereinafter referred to as a nanolayer. For example, a GAA FET provides a relatively small FET footprint by forming the channel region as a series of vertically stacked nanolayers. In a GAA configuration, a GAA FET includes a source region, a drain region and vertically stacked nanolayer channels between the source and drain regions. These devices typically include one or more suspended nanolayers that serve as the channel. A gate surrounds the stacked nanolayers and regulates electron flow through the nanolayers between the source and drain regions. GAA FETs may be fabricated by forming alternating layers of active nanolayers and sacrificial nanolayers. The sacrificial nanolayers are released from the active nanolayers before the FET device is finalized. For n-type FETs, the active nanolayers are typically silicon (Si) and the sacrificial nanolayers are typically silicon germanium (SiGe). For p-type FETs, the active nanolayers can be SiGe and the sacrificial nanolayers can be Si. In some implementations, the active nanolayers of a p-type FET can be SiGe or Si, and the sacrificial nanolayers can be Si or SiGe. Forming the nanolayers from alternating layers of active nanolayers formed from a first type of semiconductor material (e.g., Si for n-type FETs, and SiGe for p-type FETs) and sacrificial nanolayers formed from a second type of semiconductor material (e.g., SiGe for n-type FETs, and Si for p-type FETs) may provide for superior channel electrostatics control, which is necessary for continuously scaling gate lengths.

For some transistors, integration of the transistors with a backside back-end-of-line (BEOL) network is one of the key challenges to providing increasing packaged IC device densities and performance increases. By incorporating a backside BEOL network into the semiconductor IC device, routing congestion may be eased. Currently, there is a need for semiconductor IC device fabrication techniques that allow for both a frontside contact to connect against a frontside of a first gate and a backside contact to connect against a backside of a second gate.

Referring now to FIG. 1, that depicts a cross-section view of a semiconductor IC device 10 that includes a backside contact 38 that is electrically connected with an upper source/drain (S/D) region 34 of an upper transistor 30. The backside contact 38 may further be electrically connected to a backside back end of line (BEOL) network 70.

The semiconductor IC device 10 may further include a lower transistor 12. The upper transistor 30 may include an active region that overlaps with an active region of the lower transistor 12. For example, a lower transistor 12 region, such as a lower S/D region 14 may be inset with respect to the upper transistor 30. The lower transistor 12 and the upper transistor 30 may share a same gate structure (not shown in the depicted cross-section).

The portion of the gate structure, in the lower transistor 12, may be around and may directly contact each of a series of vertically stacked channels 16. Respective lower S/D region(s) 14 may be connected to respective end surfaces of the series of vertically stacked channels 16. For example, a source region is connected to front end surfaces of the series of vertically stacked channels 16 and a drain region is connected to rear end surfaces of the series of vertically stacked channels 16.

The portion of the gate structure, in the upper transistor 30, may be around and may directly contact each of a series of vertically stacked channels 36. Respective upper S/D region(s) 34 may be connected to respective end surfaces of the series of vertically stacked channels 36. For example, a source region is connected to front end surfaces of the series of vertically stacked channels 36 and a drain region is connected to rear end surfaces of the series of vertically stacked channels 36.

At least a portion of a sidewall of the backside contact 38 is covered by a dielectric contact liner 22. The lower S/D region 14 may include a recessed sidewall 15 that faces the backside contact 38. The dielectric contact liner 22 may be directly between the sidewall of the backside contact 38 and the recessed sidewall 15 of the lower S/D region 14. One or more other sidewalls 13 of the lower S/D region 14 may directly contact a lower interlayer dielectric (ILD) 20 that consists of a dielectric material that is different from the dielectric material of the dielectric contact liner 22. For example, the dielectric material of the dielectric contact liner 22 has etch selectivity with respect to the dielectric of the lower ILD 20. In an example, where the lower S/D region 14 is laterally indented horizontally, the recessed sidewall 15 may be substantially vertical. In an example, as depicted, where the lower S/D region 14 is laterally indented by etching the portion of the lower S/D that is exposed by the formation of the opening of the backside contact 38, the recessed sidewall 15 may be substantially parallel to the inwardly sloping sidewall(s) of the backside contact 38.

In an example, the backside contact 38 includes an upper portion 39 and a lower portion 37. The lower portion 37 of the backside contact 38 may include the portion of the sidewall of the backside contact 38 that is covered by a dielectric contact liner 22. The upper portion 39 of the backside contact 38 may have a larger circumference, diameter, or the like, relative to the largest circumference, diameter, or the like of the lower portion 37 of the backside contact 38.

The relatively larger circumference, diameter, or the like, of the upper portion 39 may be a result of an extension portion 41 protruding substantially horizontally from the backside contact 38 toward the lower transistor 12. Due to the relatively greater overlap between the upper transistor 30 and the lower transistor 12, which would otherwise limit the surface area between the backside contact and the upper S/D region, the extension portion 41 beneficially provides increased and/or adequate contact area between the top surface of the backside contact 38 and the upper S/D region 34. Though extension portion 41 is shown as protruding from a sidewall of the backside contact 38 that faces the lower transistor 12 (e.g., the right backside contact 38 sidewall), there may also be another extension portion protruding from a sidewall of the backside contact 38 that face away from the lower transistor 12 (e.g., the left backside contact 38 sidewall). In an example, the upper portion 39 of the backside contact 38 is horizontally surrounded by a bonding dielectric 24 which may be between the upper transistor 30 and the lower transistor 12.

Figure 19:
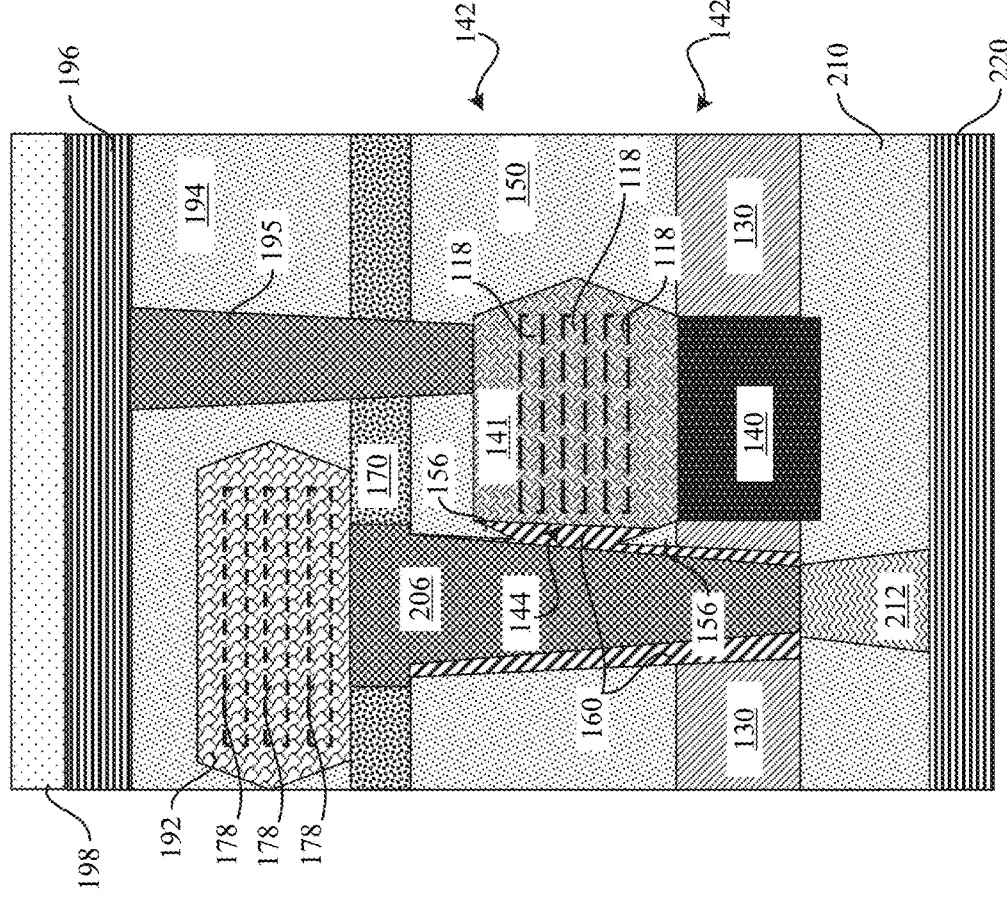
FIG. 19 through FIG. 21 depict respective fabrication structure cross-section views of respective illustrative semiconductor IC devices that include a backside contact that is electrically connected with a region of an upper transistor and that may further be electrically connected to a backside BEOL network, according to one or more embodiments of the disclosure.

In an example, the bottom S/D region 14 may be connected to a frontside BEOL network 50 by way of a frontside contact (e.g., this example is depicted in FIG. 19). In alternative examples, the bottom S/D region 14 may be connected to a backside BEOL network 70 by at least a backside contact 40.

The backside contact 38 and the backside contact 40 may connect with the backside BEOL network 70 by a backside interconnect 64 and a backside interconnect 62, respectively. The backside interconnects 62, 64 may be a middle of line (MOL) type contact that connects the backside contacts 38, 40, respectively, to the backside BEOL network 70 or alternatively may be a vertical interconnect access (VIA) within a lowest level of the backside BEOL network 70.

The semiconductor IC device 10 may be fabricated by semiconductor IC device fabrication techniques that allow for the backside contact 38 to be located relatively closer to the lower S/D region 14 while the dielectric contact liner 22 reduces the propensity of electrical shorting therebetween. In other words, the overlap between the upper transistor 30 and the lower transistor 12 may be increased which may lead to further device scaling. To achieve these and potential other benefits, material that later forms the dielectric contact liner 22 is deposited within the semiconductor IC device 10. This material may effectively allow for self-aligned formation of a backside contact opening within the dielectric contact liner 22 material that is used to later create the backside contact 38 with reduced risk of that opening extending into the neighboring lower S/D region 14. The ability to self-align the formation of the backside contact opening may allow for the placement of such opening (and resulting location of the associated backside contact 38) to be relatively closer to lower S/D region 14 compared to non-self-aligned backside contact opening formation techniques. The dielectric contact liner 22 material that remains may effectively form the dielectric contact liner 22 and may be located directly between the backside contact 38 and the lower S/D region 14, be located directly between the backside contact 38 and the recessed sidewall 15 of the lower S/D region 14, or the like.

Figure 2:
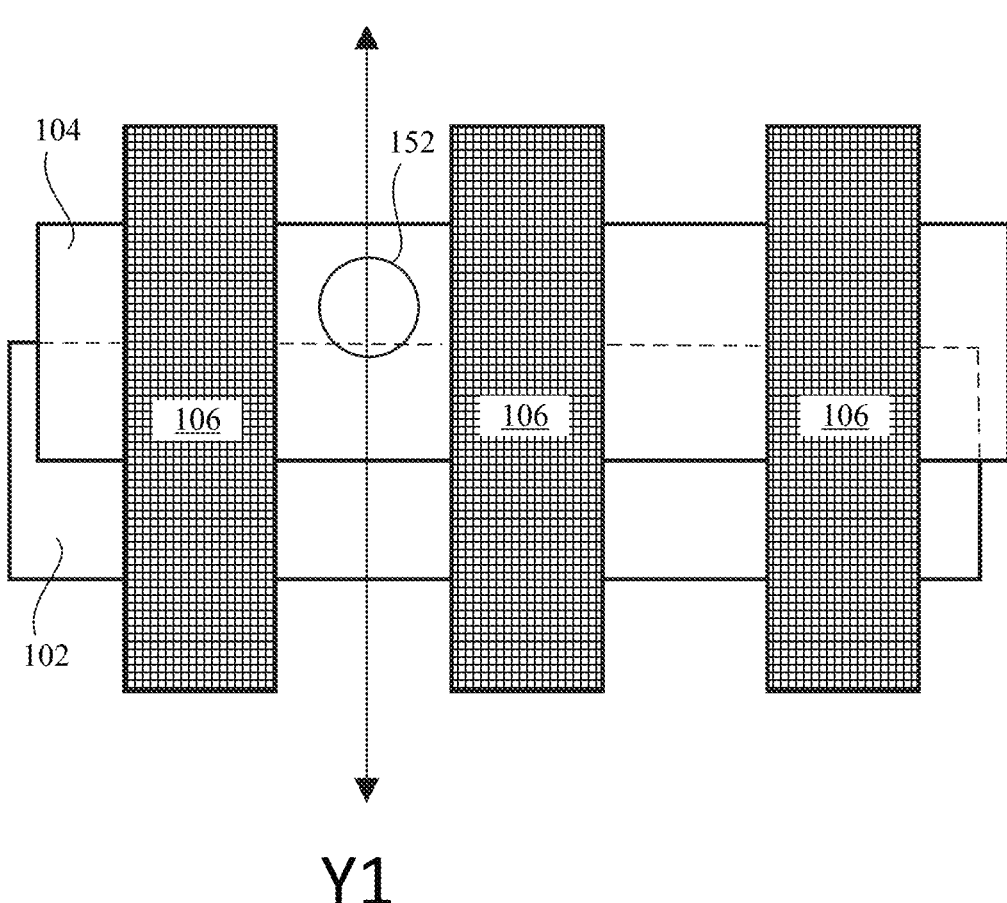
FIG. 2 depicts a partial top-down structure view of an illustrative semiconductor IC device and establishes a cross-sectional plane for the views of the semiconductor IC devices of FIG. 3 through FIG. 21, according to one or more embodiments of the disclosure.
Figure 3:
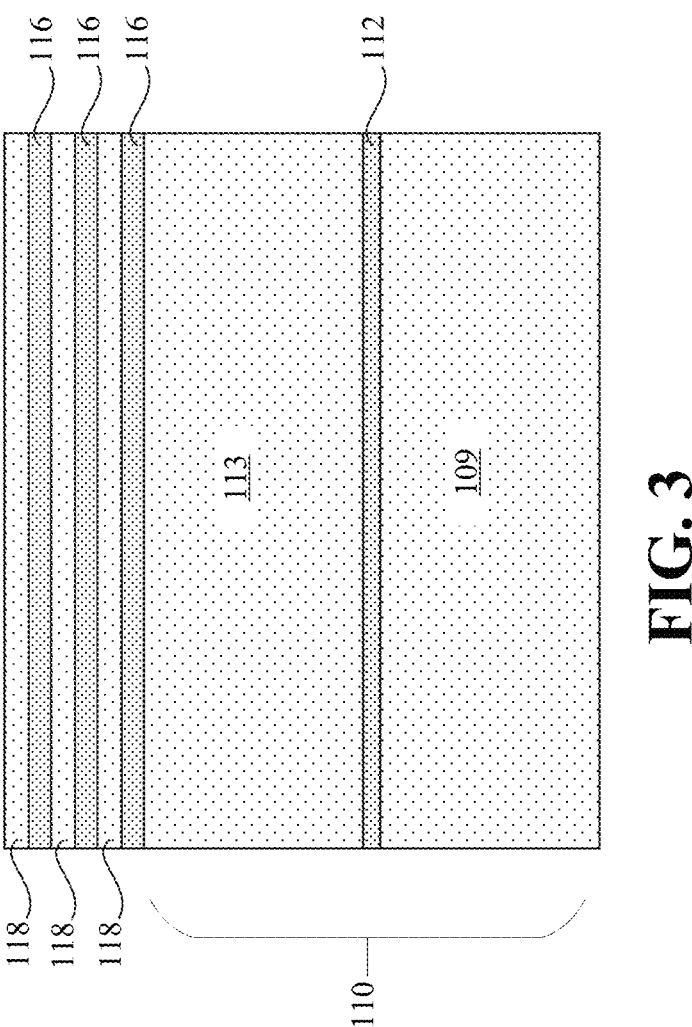
FIG. 3 through FIG. 17 depict various fabrication structure cross-section views of an illustrative semiconductor IC device that includes a backside contact that is electrically connected with a region of an upper transistor and that may further be electrically connected to a backside BEOL network, according to one or more embodiments of the disclosure.

FIG. 2 depicts a partial top-down structure view of a semiconductor IC device 100 and establishes an illustrative cross-sectional plane Y1 for the views of the semiconductor IC device structures of the disclosure. The illustrated semiconductor IC device 100 includes an upper transistor active region 104 and a lower transistor active region 102. As depicted, the upper transistor active region 104 overlaps with the lower transistor active region 102. Upper S/D region(s) of the upper transistor may be formed within the upper transistor active region 104 between gate structures 106. Similarly, lower S/D region(s) of the lower transistor may be formed within the lower transistor active region 102 between gate structures 106. FIG. 3 defines a plane Y1 across the lower transistor active region 102 and across the upper transistor active region 104 in between adjacent gate structure 106. The plane Y1 is an illustrative plane of the cross-sectional views of the semiconductor IC devices of the description of the embodiments. The Y1 plane is utilized for the cross-sectional view of semiconductor IC device 10 of FIG. 1, the fabrication views of the semiconductor IC device 100 of FIG. 3 through FIG. 17, the cross-sectional view of semiconductor IC device 400 of FIG. 19, the cross-sectional view of semiconductor IC device 500 of FIG. 20, and the cross-sectional view of semiconductor IC device 600 of FIG. 21.

FIG. 3 depicts a cross-sectional view of a semiconductor IC device 100 that is to include a backside contact that is electrically connected with a region of an upper transistor and that may further be electrically connected to a backside BEOL network. In these initial fabrication stages, nanolayers may be formed upon a substrate structure.

For example, alternating sacrificial nanolayers 116 and active nanolayers 118 may be formed upon a substrate structure 110. The substrate structure 110 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In the depicted implementation, the substrate structure 110 includes an upper substrate 113, a lower substrate 109, and an etch stop layer 112 between the upper substrate 113 and the lower substrate 109. The upper substrate 113 and the lower substrate 109 may be comprised of any other suitable material(s) than those listed above, and the etch stop layer 112 may be a dielectric material with etch selectivity to one or both of the upper substrate 113 and/or the lower substrate 109. In one example, the etch stop layer 112 may be an oxide and the substrate structure 110 may be referred to as a buried oxide (BOX) substrate. In another example, the lower substrate 109 may be composed of Si. The etch stop layer 112 may be composed of Silicon Germanium (SiGe) and may be epitaxially grown from the top surface of lower substrate 109, and the upper substrate 113 may be composed of Si and may be epitaxially grown from the top surface of etch stop layer 112.

Nanolayers may be formed over the substrate structure 110 by forming a series of alternating sacrificial nanolayers 116 and active nanolayers 118 thereupon. In certain examples, certain layer(s) may be formed between the upper surface of the substrate structure 110 and the bottommost sacrificial nanolayer 116. The sacrificial nanolayers 116 may be SiGe sacrificial nanolayers and the active nanolayers 118 may be Si nanolayers. The sacrificial nanolayers 116 can have Ge % ranging from 20% to 45%. In an implementation, the alternating sacrificial nanolayers may be formed by epitaxially growing one layer and then the next until the desired number and desired thicknesses of the layers are achieved. Any number of alternating nanolayers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

In the illustrated semiconductor IC device 100, there are a total of three sacrificial nanolayers 116 and three active nanolayers 118. However, it should be appreciated that any suitable number of alternating nanolayers may be formed. Although it is specifically contemplated that the sacrificial nanolayers 116 can be formed from SiGe and that the active nanolayers 118 can be formed from Si, it should be understood that any appropriate materials can be used instead, as long as the semiconductor materials have etch selectivity with respect to one or more of the others, as is consistent with the description of the fabrication stages herein.

Although it is specifically contemplated that the sacrificial nanolayers 116 and the active nanolayers 118 are formed by epitaxial growth, such nanolayers can be formed by any appropriate mechanism, such as chemical vapor deposition (CVD), physical vapor deposition (PVD), atomic layer deposition (ALD), or gas cluster ion beam (GCIB) deposition, or the like.

In certain embodiments, the nanolayers have a vertical thickness ranging, for example, from approximately 3 nm to approximately 20 nm. In certain embodiments, the nanolayers have a vertical thickness ranging, for example, from approximately 3 nm to approximately 10 nm. Although the range of 3-20 nm is cited as an example range of thickness of the nanolayers, other thickness of these nanolayers may be used. In certain examples, certain of the nanolayers may have different thicknesses relative to one another. In certain examples, it may be desirable to have a small vertical spacing (VSP) between adjacent active nanolayers 118 to reduce the parasitic capacitance and to improve circuit speed. For example, the VSP (the distance between vertically adjacent active nanolayers 118) may range from 5 nm to 15 nm. However, the VSP must be of a sufficient value to accommodate the formation of a gate that is to be formed in the spaces created by later removal of respective portions of the sacrificial nanolayers 116.

Figure 4:
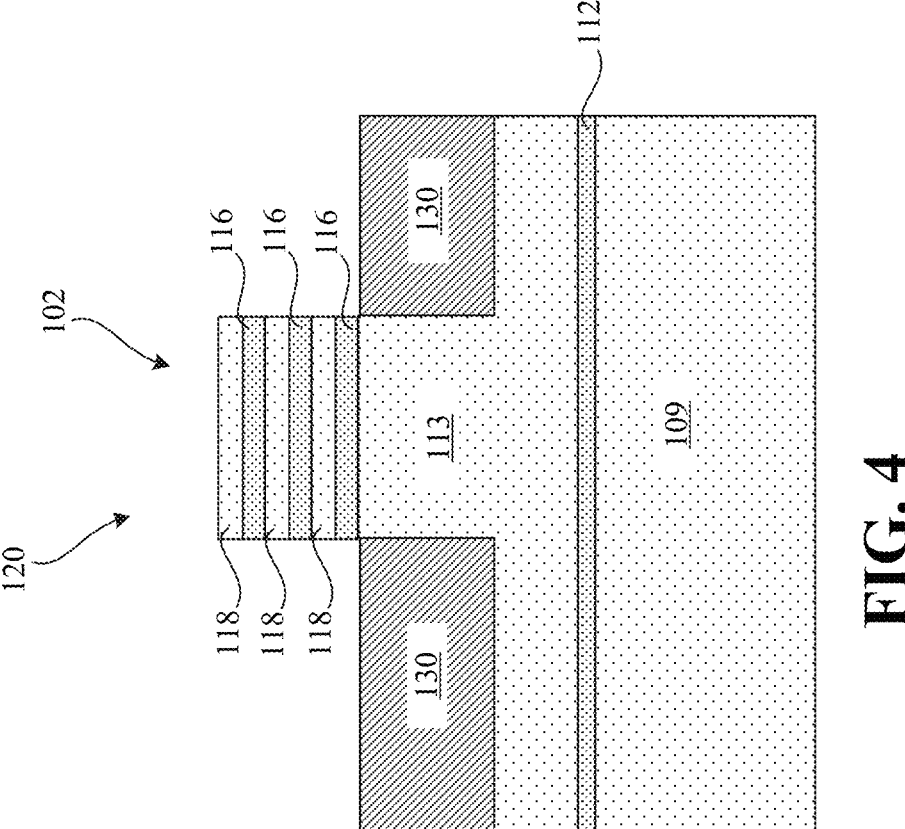

FIG. 4 depicts a cross-sectional view of a semiconductor IC device 100 that is to include a backside contact that is electrically connected with a region of an upper transistor and that may further be electrically connected to a backside BEOL network. In the depicted stages, the nanolayers are patterned into nanolayer stacks, and shallow trench isolation (STI) regions are formed.

For example, the nanolayers may be patterned into nanolayer stacks 120 and shallow trench isolation (STI) regions 130 may be formed. To form one or more nanolayer stacks 120, a mask layer (not shown) may be formed on the uppermost nanolayer. The mask layer may be comprised of any suitable mask material(s). The mask layer may be patterned and used to perform the nanolayer stack 120 patterning process. In the nanolayer stack 120 patterning process, any suitable material removal process (e.g., reactive ion etching or RIE) may be used to remove portions of the alternating nanolayers down to the level of the substrate structure 110, or the like. Following the nanolayer stack 120 patterning process, one or more nanolayer stacks 120 are formed. Subsequently, the mask layer may be removed. A horizontal width of a first nanolayer stack 120 may define a horizontal dimension (e.g., left to right) and a perpendicular horizontal dimension (e.g., into and out of the page) of lower transistor active region 102.

The removal of undesired portion(s) of the alternating nanolayers may further remove undesired portions of substrate structure 110 that are adjacent to respective footprints of nanolayer stacks 120 to form STI region openings. The etch may be timed or otherwise controlled to stop the removal of the substrate structure 110 such that the depth or bottom of the one or more STI region openings has a predetermined or desired dimension. For example, the depth or bottom of the one or more STI region openings may be above the etch stop layer 112, as depicted. In some examples, the etch to form the nanolayer stacks 120 may utilize the etch stop layer 112 to stop the etch and form the bottom well of the one or more STI region openings.

A STI region 130 may be formed upon and/or within the substrate structure 110 within respective STI region openings. The STI regions 130 may be formed by depositing electrical dielectric material(s) within respective STI region opening(s) that are adjacent to the one or more nanolayer stacks 120. A top surface of the one or more STI regions 130 may be coplanar with a top surface of the substrate structure 110. The one or more STI regions 130 may have a volume and/or geometry that sufficiently electrically isolates components or features of neighboring transistors, or the like, may sufficiently electrically isolate neighboring nanolayer stacks 120, and/or may sufficiently electrically isolate neighboring active regions. For clarity, a particular STI region 130 may separate and adequately electrically isolate neighboring lower transistor active regions 102.

In an example, the STI region(s) 130 may be formed by depositing a STI liner within the STI region openings. Subsequently, STI region(s) 130 may be further formed by depositing a STI dielectric material upon a STI liner. An etch back, recess, or the like, may occur to remove undesired or over formed STI liner and/or STI dielectric material, such that the top surface of the STI region(s) 130 is/are coplanar with a top surface of the substrate structure 110. STI liner may be composed of but not limited to a nitride, low-κ nitride (i.e., a nitride material with a lower dielectric constant relative to $SiO_2$), or the like. The STI dielectric material may be composed of but not limited to an oxide, low-κ oxide (i.e., an oxide material with a lower dielectric constant relative to $SiO_2$), or the like.

Figure 5:
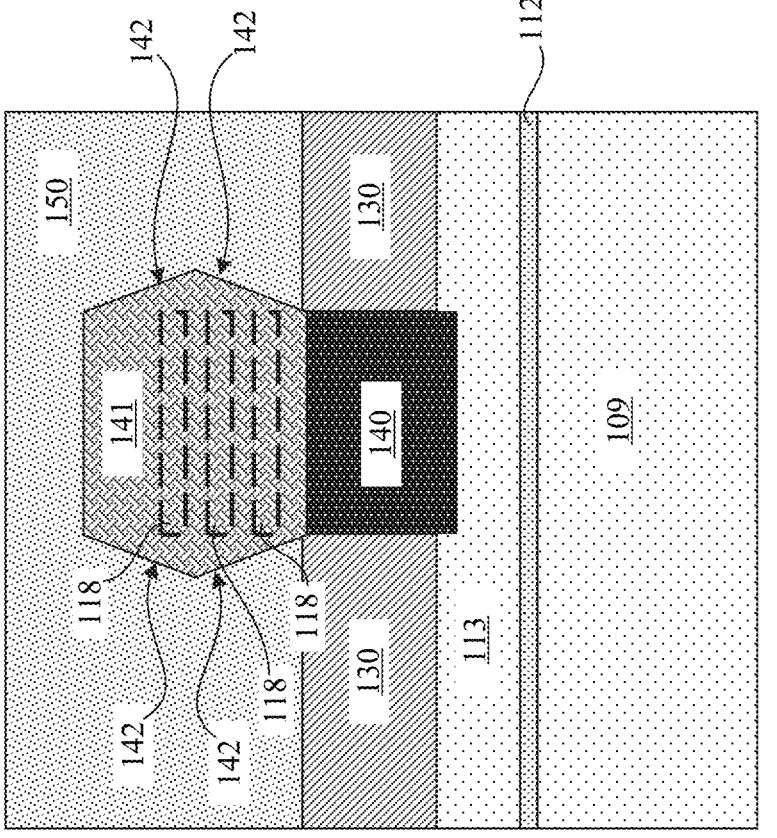

FIG. 5 depicts cross-sectional views of the semiconductor IC device 100 after fabrication operations, in accordance with embodiments of the present disclosure. In the depicted fabrication stages, one or more lower sacrificial gate structures (not shown) may be formed. Further in the depicted fabrication stages, lower gate spacers (not shown) may be formed. Further in the depicted fabrication stages, source/drain (S/D) recesses may be formed within the one or more nanolayer stacks between the lower gate spacers of neighboring lower sacrificial gate structures. Further in the depicted fabrication stages, the sacrificial nanolayers may be indented and a respective lower inner spacer (not shown) may be formed within respective indents. Further in the depicted fabrication stages, a bottom transistor backside contact placeholder may be formed within respective source/drain (S/D) recesses. Further in the depicted fabrication stages, a bottom S/D region may be formed upon respective backside contact placeholders. Further in the depicted fabrication stages, a bottom interlayer dielectric (ILD) and lower gate cut regions may be formed.

In the depicted fabrication stages, one or more lower sacrificial gate structures (not shown) may be formed and may include a lower sacrificial gate liner (not shown), a lower sacrificial gate (not shown), and a lower sacrificial gate cap (not shown). The lower sacrificial gate structures may be formed by initially depositing a lower sacrificial gate liner layer (e.g., a dielectric, oxide, or the like) upon the one or more STI regions 130, upon and around the one or more nanolayer stacks 120. The lower sacrificial gate structures may further be formed by subsequently depositing a lower sacrificial gate layer (e.g., amorphous silicon, or the like) upon the lower sacrificial gate liner layer. The thickness of the lower sacrificial gate layer may be such that the top surface of the lower sacrificial gate layer is above the top surface of the one or more nanolayer stacks 120. The lower sacrificial gate structures may further be formed by forming a gate cap layer upon the lower sacrificial gate layer. The gate cap layer may be formed by depositing a mask material, such as a hard mask material, such as silicon nitride, silicon oxide, combinations thereof, or the like, upon the lower sacrificial gate layer. The gate cap layer may be composed of one or more layers of masking materials to protect the lower sacrificial gate layer and/or other underlying materials during subsequent processing of semiconductor IC device 100.

The one or more lower sacrificial gate structures may further be formed by patterning the gate cap layer, lower sacrificial gate layer, and lower sacrificial gate liner by, for example, using lithography and etch processes to remove undesired portions and retain desired portion(s), respectively. The retained portion(s) of the gate cap layer, lower sacrificial gate layer, and lower sacrificial gate liner may form the lower sacrificial gate liner (not shown), the lower sacrificial gate (not shown), and the lower sacrificial gate cap (not shown), respectively, of each of the one or more lower sacrificial gate structures.

One or more lower sacrificial gate structures can be formed on targeted regions or areas of semiconductor IC device 100 to define the gate length of one or more bottom transistors and to provide sacrificial material for yielding targeted bottom transistor structure(s) in subsequent processing.

Further in the depicted fabrication stages, lower gate spacers (not shown) may be formed. The gate spacer(s) may be formed upon the sidewall(s) of the lower sacrificial gate structures, upon the STI region(s) 130, and around the one or more nanolayer stacks 120.

The gate spacer(s) may be formed by a conformal deposition of a dielectric material, such as silicon nitride, SiBCN, SiNC, SiN, SiCO, SiNOC, or a combination thereof, or the like, upon STI regions 130, upon and around the one or more lower sacrificial gate structures, and upon and around the one or more nanolayer stack(s) 120. Subsequently, undesired portions of dielectric material may be removed while desired portions the dielectric material may be retained and thereby form the gate spacer(s). The undesired portions of dielectric material may be removed by a directional ion etch, such as a reactive ion etch (RIE).

Further in the depicted fabrication stages, source/drain (S/D) recesses may be formed within the one or more nanolayer stacks 120 between lower gate spacers of neighboring lower sacrificial gate structures. In other words, a single nanolayer stack 120 may be separated, by a S/D recess, into multiple nanolayer stacks 120 each located underneath a respective lower sacrificial gate structure. Further in the depicted fabrication stages, sacrificial nanolayers 116 may be indented and a respective lower inner spacer may be formed in each indent.

The one or more S/D recesses may be formed between adjacent lower sacrificial gate structures by removing respective portions of the sacrificial nanolayers 116 and active nanolayers 118 (shown in FIG. 4), that are between lower gate spacers of adjacent or neighboring lower sacrificial gate structures. The one or more S/D recesses may be formed to a depth to stop at the top surface of the substrate structure 110 (e.g., the top surface of upper substrate 113, or the like), the top surface of STI regions 130, or the like. Alternatively, as depicted, the one or more S/D recesses may be formed to a depth within the upper substrate 113 above the etch stop layer 112 so that backside contact placeholder(s) 140 may be formed therewithin.

The undesired portions of sacrificial nanolayers 116 and active nanolayers 118 may be removed by etching or other subtractive removal techniques. The top surface of the substrate structure 110 may be used as an etch stop or other etch parameters may be controlled to stop the material removal at the substrate structure 110. As the lower gate spacers and the lower sacrificial gate structures may be utilized to protect the underlying portions of sacrificial nanolayers 116, active nanolayers 118, respective sidewalls of the nanolayer stacks 120 may be substantially coplanar and substantially vertical with the outer sidewalls of the lower gate spacers, there above.

As used herein, "substantially vertical" sidewalls deviate from a direction normal to a major surface (e.g., top surface, etc.) of the substrate 113 by no more than 5°, e.g., 0°, 1°, 2°, 3° 4°, or 5°, including ranges between any of the foregoing values.

Further, horizontal or lateral indents may be formed by laterally or horizontally (e.g., into and/or out of the page of the depicted Y1 cross-section) removing respective portions of sacrificial nanolayers 116 within the nanolayer stacks 120. The indents may be formed by a reactive ion etch (RIE) process, which can remove portions of the sacrificial nanolayers 116. The horizontal depth of the indents may be chosen to set a length for a replacement gate structure that is formed in place of one lower sacrificial gate structure. When the sacrificial nanolayers 116 are composed of SiGe and when active nanolayers 118 are Si, the directional RIE can use a boron-based chemistry or a chlorine-based chemistry, for example, which recesses or removes the exposed end portions of sacrificial nanolayers 116 (e.g., end portions of sacrificial nanolayers 116 generally below the gate spacer) selective to the Si active nanolayers 118. In alternative implementations when sacrificial nanolayers 116 are not SiGe and when active nanolayers 118 are not Si, the directional etch of the sacrificial nanolayers 116 may generally be selective to the active nanolayers 118, lower gate spacers, STI regions 130, and/or substrate structure 110.

Further in the depicted fabrication stages, a respective lower inner spacer (not shown) is formed within each indent. The one or more lower inner spacers can be formed by ALD or CVD or any other suitable deposition technique that deposits a dielectric material within the indent(s), thereby forming the lower inner spacer(s). In some examples, the lower inner spacer(s) are composed of a low-κ dielectric material (a material with a lower dielectric constant relative to $SiO_2$), SiN, SiO, SiBCN, SiOCN, SiCO, etc. or any other suitable dielectric material. In certain implementations, after the formation of the lower inner spacer(s), an isotropic etch process is performed to create substantially vertical sidewalls of the lower inner spacer(s) that are coplanar with the substantially vertical sidewalls of the active nanolayers 118, of the lower gate spacers, or the like.

Further in the depicted fabrication stages, one or more lower transistor backside contact placeholders 140 are formed within the substrate structure 110 in between adjacent lower sacrificial gate structures within a respective S/D recess. In one example, the one or more backside contact placeholders 140 may be formed only in locations in which a backside contact, such as backside contact 208 depicted in FIG. 17, or the like, is to be formed. In an alternative example, a respective backside contact placeholder 140 may be formed in each lower transistor S/D region location.

If the S/D recesses are not already of sufficient depth to form the backside contact placeholders 140 within the substrate structure 110, the one or more backside contact placeholders 140 may be formed by initially forming one or more backside contact placeholder cavities within the substrate structure 110 generally in between adjacent lower sacrificial gate structures (e.g., the vertical depth of the one or more S/D recesses may be increased). For example, the one or more backside contact placeholder(s) cavities may be formed by a subtractive removal technique, such as an etch, that removes associated portion(s) of the upper substrate 113. The etch may be timed or otherwise controlled to stop the removal of the upper substrate 113 such that the depth or bottom of the one or more backside contact placeholder(s) cavities are above the etch stop layer 112.

The one or more backside contact placeholders 140 may be further formed by epitaxially growing an epitaxial material from exposed substrate structure 110 surface(s) within the one or more backside contact placeholder(s) cavities. In some embodiments, epitaxial growth and/or deposition processes may be selective to forming on the semiconductor surfaces of the upper substrate 113, and may not deposit material on dielectric surfaces, such as silicon dioxide or silicon nitride surfaces. In some embodiments, the epitaxial growth of the one or more backside contact placeholders 140 may overgrow above the top surface of the substrate structure 110 or above the top surface of STI regions 130. In an example, the epitaxial material of the one or more backside contact placeholders 140 may be chosen to be etch selective to the material of the lower S/D region(s) 141, the material of the upper substrate 113, or the like. In another example, an etch stop layer (not shown) (e.g., a Si epitaxially grown layer, or the like) may be formed upon the top surface of the backside contact placeholders 140. For example, the one or more backside contact placeholders 140 may be SiGe and a Si etch stop layer may be epitaxially grown from the top surface of the SiGe backside contact placeholders 140. Respective top surfaces of the backside contact placeholders 140 (or etch stop layer thereupon) may be substantially horizontal and below the bottom surface of the bottommost active nanolayer 118 (e.g., to enable contact between such active nanolayer 118 and the bottom S/D region 141).

Further in the depicted fabrication stages, a respective lower S/D region 141 is formed upon a backside contact placeholder 140. The lower S/D region 141 forms either a source or a drain, respectively, of respective lower transistor, such as a GAA FET, and is connected to respective a side or end surface of the active nanolayers 118 of a nanolayer stack 120. The S/D region 141 is composed of a semiconductor material and a dopant. As used herein, a "source/drain" region can be a source region or a drain region depending on subsequent wiring and application of voltages during operation of the transistor. The semiconductor material that provides each lower S/D region 141 is composed of one of the semiconductor materials mentioned above for the semiconductor structure. The semiconductor material that provides the lower S/D region 141 can be compositionally the same, or compositionally different from each active nanolayers 118. The dopant that is present in the lower S/D region 141 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the S/D regions can have a dopant concentration of from $4\times10^{20}$ atoms/cm$^3$ to $3\times10^{21}$ atoms/cm$^3$.

The one or more lower S/D regions 141 may be epitaxially grown or formed and may, therefore, include one or more diamond surfaces 142 (e.g., the lower S/D region 141 may have one or more (111) orientated diamond like crystallographic surfaces, as depicted). In some examples, the lower S/D regions 141 are formed by in-situ doped epitaxial growth. The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In examples, the S/D epitaxial growth conditions that promote in-situ Boron doped SiGe for p-type transistor and phosphorus or arsenic doped silicon or Si:C for n-type transistors.

In some examples, the epitaxial growth that forms the one or more lower S/D region 141 occurs or is promoted from the top surface of upper substrate 113, from the upper surface of backside contact placeholders 140 (or etch stop layer thereupon), while epitaxial growth is limited or does not occur from neighboring STI regions 130.

In some embodiments, epitaxial growth to form the one or more lower S/D regions 141 may overgrow above the upper surface of the lower sacrificial gate structure(s) and be subsequently recessed such that the top surface of the lower S/D region 141 may be substantially horizontal and above the top surface of the topmost active nanolayer 118 within the nanolayer stacks 120 (e.g., to enable contact between such active nanolayer 118 and the lower S/D region 141).

Further in the depicted fabrication stages, an interlayer dielectric (ILD) 150 may be formed. For example, a blanket lower ILD 150 material may be deposited over the S/D region(s) 141, over the STI region(s) 130, over the lower sacrificial gate structures, and over the lower gate spacers associated with adjacent lower sacrificial gate structures.

The lower ILD 150 can be any suitable material, such as, for example, porous silicates, carbon doped oxides, silicon dioxides, silicon nitrides, silicon oxynitrides, OPL, or other dielectric materials. Any known manner of forming the lower ILD 150 can be utilized. The lower ILD 150 can be formed using, for example, CVD, PECVD, ALD, flowable CVD, spin-on dielectrics, or PVD.

Figure 8:
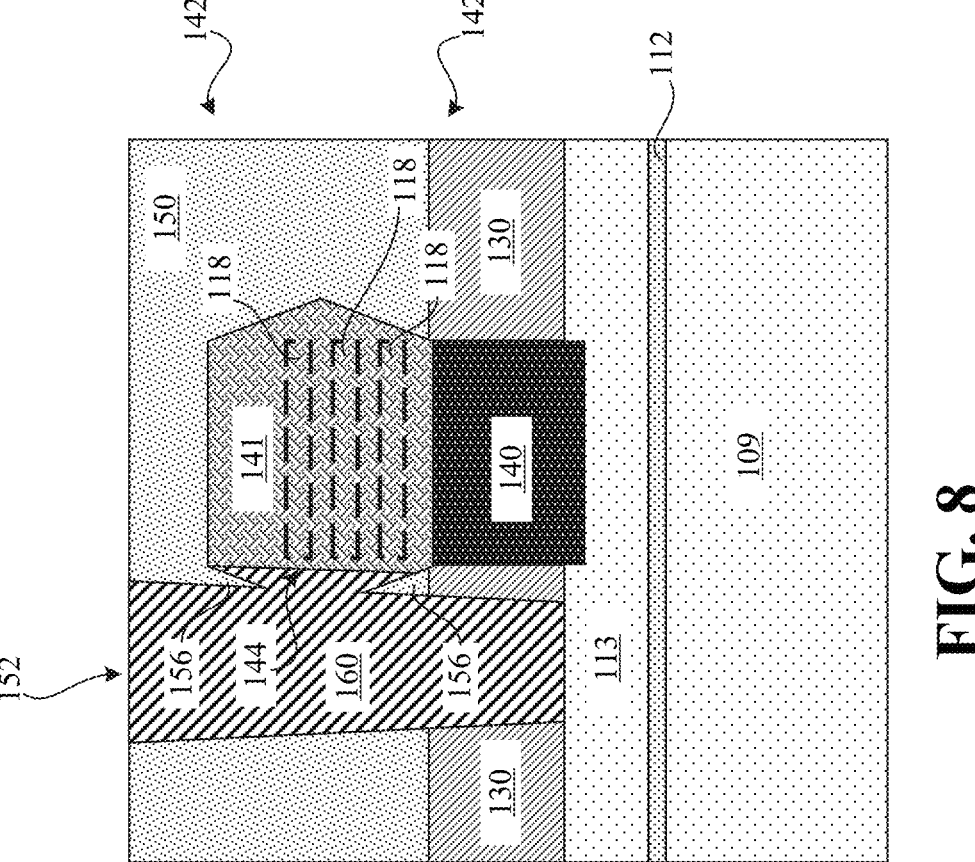

In an example, the lower ILD 150 may be formed to a thickness above the top surface of the lower sacrificial gate structures. Subsequently, a planarization process, such as a CMP, may be performed to remove excess lower ILD 150 material and to remove the lower sacrificial gate caps of the lower sacrificial gate structures, thereby exposing the lower sacrificial gate thereunder. The planarization process at this fabrication stage may be optional and may occur after the formation of the lower ILD fill 160, as depicted in FIG. 8. The planarization may also partially remove some of the lower sacrificial gates or may at least expose the lower sacrificial gate of the lower sacrificial gate structures. The CMP may create a substantially planar or substantially horizontal top surface for the semiconductor IC device 100. In other words, the respective top surfaces of the lower ILD 150, lower gate spacers, lower sacrificial gates, etc. may be substantially coplanar and/or substantially horizontal.

Lower gate cut region(s) may be formed within the sacrificial gate structure. For example, a gate cut opening may be formed within the sacrificial gate structure in between associated lower gate spacer(s). The gate cut opening may expose an upper surface of a portion of the gate liner, an upper surface of a portion of the STI region(s) 130, an upper surface of substrate structure 110, or the like.

The gate cut opening may be formed by lithography and etch process, where a mask may be applied and patterned. An opening in the patterned mask may expose the portion of the underlying lower sacrificial gate structure to be removed while other protected portions of the lower sacrificial gate structure thereunder may be protected and retained. Lower gate cut region(s) may be further formed by depositing dielectric material such as silicon nitride (SiN), a combination of SiN and Silicon Dioxide ($SiO_2$), or the like, within the gate cut opening. Subsequently, excess mask material and/or excess lower gate cut region material may be removed and planarized by e.g., a CMP. As such, respective top surfaces the lower sacrificial gate structure, lower gate spacer(s), lower ILD 150, and lower gate cut region(s) may be coplanar.

Figure 6:
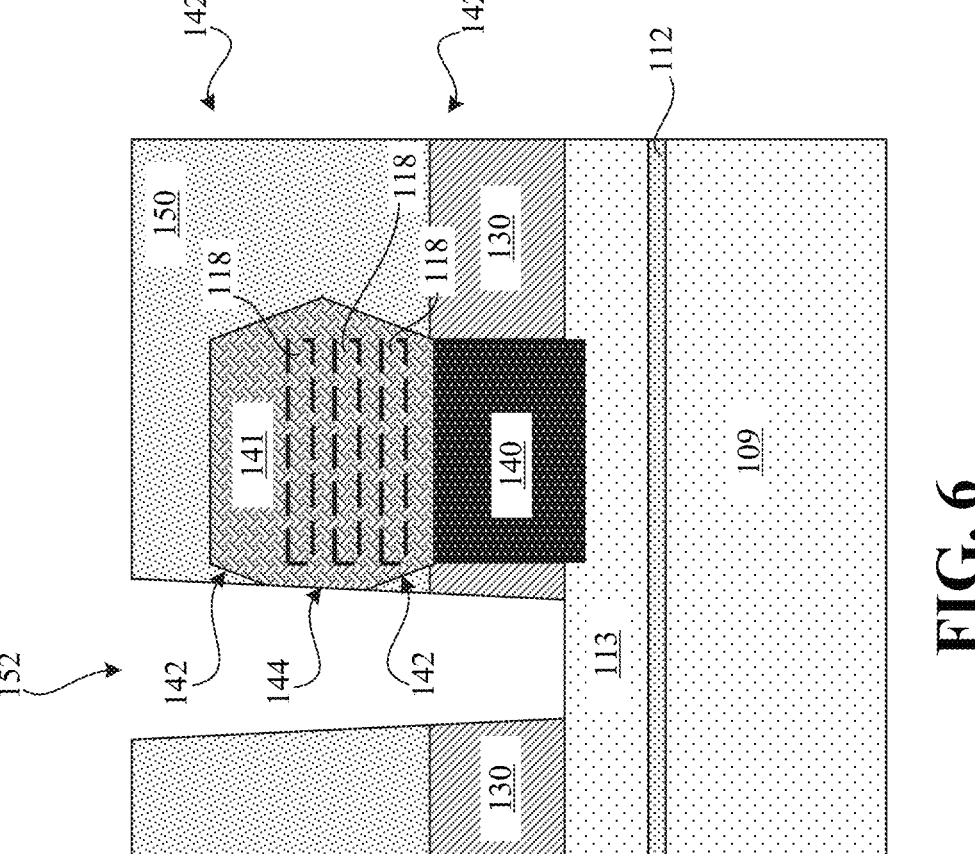

FIG. 6 depicts cross-sectional views of the semiconductor IC device 100 after fabrication operations, in accordance with embodiments of the present disclosure. In the depicted fabrication stages, one or more lower S/D region cut openings 152 may be formed.

The lower S/D region cut opening(s) 152 may be formed by depositing and patterning a mask (not shown). For example, the mask may be formed and patterned to create an opening therein. The mask, which may consist of a nitride material, such as, but not necessarily limited to, silicon nitride (SiN) or titanium nitride (TiN), a low temperature oxide, such as an organic planarization layer (OPL), may be formed on the lower ILD 150. The mask can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), or the like.

Subsequently, a photoresist (not shown) may be formed over the mask. The photoresist may include a positive-tone photoresist composition, a negative-tone photoresist composition, or a hybrid-tone photoresist composition. A layer of photoresist material may be formed by a deposition process such as, for example, spin-on coating. The deposited photoresist may be subjected to a pattern of irradiation, and the exposed photoresist material is developed utilizing resist developer. The pattern provided by the patterned photoresist material is transferred through the mask to form the opening therein.

The pattern transfer etching process to form the lower S/D region cut opening(s) 152 may be an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

The lower S/D region cut opening(s) 152 may be further formed by subjecting the semiconductor IC device 100 to a etch stage, to remove portions of the lower ILD 150 and a portion of the lower S/D region 141. For example, the etch creates the upper S/D region cut opening(s) 152 within the lower ILD 150 and recesses one or more diamond surfaces 142 of the lower S/D region 141 to thereby form a one or more respective recessed sidewall(s) 144 of the lower S/D region 141. In other words, the lower S/D region cut opening(s) 152 generally removes and therefore exposes at least a portion of an associated sidewall of the respective lower S/D region(s) 141. The removed and exposed portion of the sidewall of the respective lower S/D region(s) 141 is referred to herein as recessed sidewall 144.

The etch may be timed or otherwise controlled to remove the material of lower ILD 150 that is exposed by the patterned mask and may remove the material of the STI region 130 there below. In an example, the etch may utilize the top surface of the substrate structure 110 as an etch stop.

Figure 7:
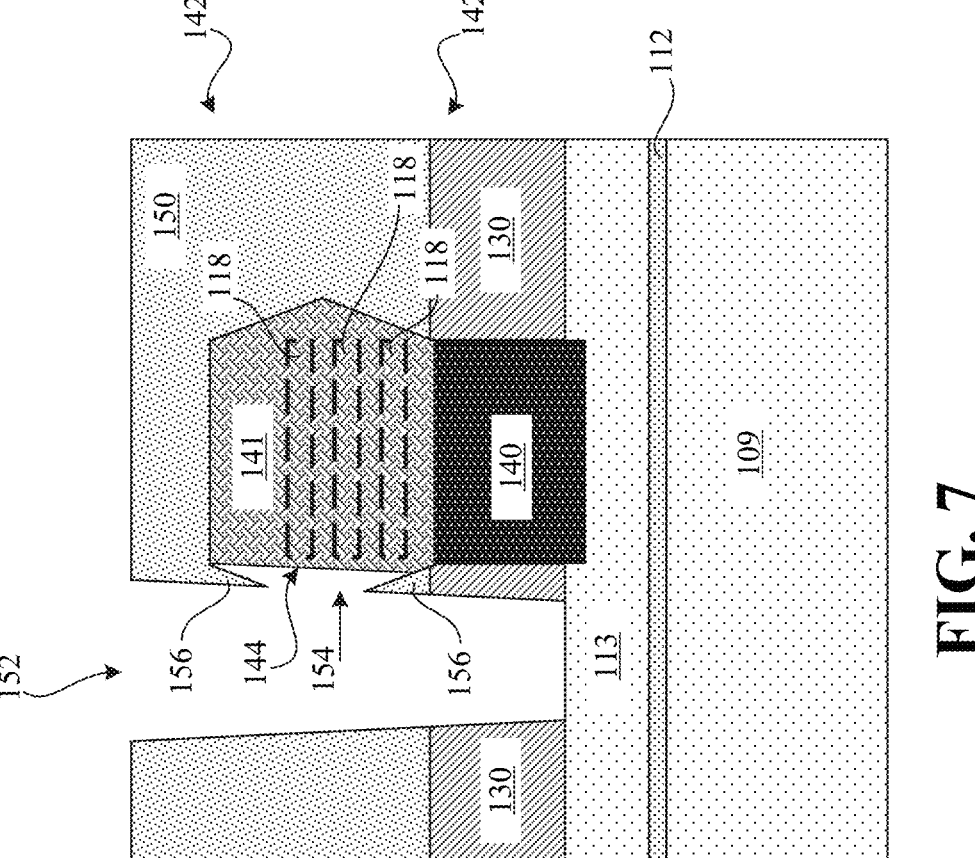

FIG. 7 depicts cross-sectional views of semiconductor IC device 100 shown after representative fabrication operation (s), in accordance with one or more embodiments. In the depicted fabrication stage, a horizontal or lateral indent 154 may be formed within the lower S/D region 141 by laterally or horizontally (e.g., left to right in the depicted Y1 cross-section) removing a portion of the lower S/D region 141.

The lateral indent 154 may be formed by a reactive ion etch (RIE) process, which can remove portions of the lower S/D region 141 substantially in the horizontal direction. In other words, the recessed sidewall 144 is further recessed substantially in the horizontal direction. In examples, the recessed sidewall 144 of the lower S/D region 141 may be substantially parallel to the nearest facing sidewall of the lower S/D region cut opening 152 and/or the recessed sidewall 144 of the lower S/D region 141 may be substantially vertical.

The removal process utilized to form the lateral indent 154 may generally remove the material of the lower S/D region 141 selective to the material of the lower ILD 150. As such, the lateral indent 154 within the lower S/D region 141 may generally expose or otherwise form one or more protrusion portion(s) 156 of the lower ILD 150 that, at the present fabrication stage(s), project into ambient air, or the like, and is thereby generally unsupported or not indirect contact with another material upon two or more sides thereof. The protrusion portion(s) 156 may be such retained portions of lower ILD 150 that are located horizontally between the lower S/D region 141 and the lower S/D region cut opening 152 after the lower ILD 150 is formed by the lower ILD 150 around the one or more diamond surfaces 142, the lower S/D region cut opening 152 is formed, and the lower S/D region 141 is laterally recessed.

As shown, a horizontal depth of the lateral indent 154 that forms the recessed sidewall 144 may result in one, more, or all recessed sidewall(s) 144 being exterior to a sidewall(s) of the backside contact placeholder 140 that faces the lower S/D region cut opening 152. In other words, the one, more, or all recessed sidewall(s) 144 may be horizontally located between the backside contact placeholder 140 and the lower S/D region cut opening 152. Alternatively, the horizontal depth of the lateral indent 154 that forms the recessed sidewall 144 may result in one, more, or all recessed sidewall(s) 144 being inset within the backside contact placeholder 140 there below. In other words, the one, more, or all recessed sidewall(s) 144 may be horizontally located between the sidewall(s) of the backside contact placeholder 140 that faces the lower S/D region cut opening 152 and the distal oppositely facing sidewall(s) of the same backside contact placeholder 140.

FIG. 8 depicts cross-sectional views of semiconductor IC device 100 shown after representative fabrication operation(s), in accordance with one or more embodiments. In the depicted fabrication stage, a lower ILD fill 160 may be formed within the lower S/D region cut opening(s) 152 against the recessed sidewall 144 of the associated lower S/D region 141.

The lower ILD fill 160 may be formed by depositing a blanket ILD material over the lower ILD 150, over the STI region(s) 130, over the substrate structure 110, and over the lower S/D region 141, or the like. The lower ILD fill 160 can be any suitable material, such as, for example, porous silicates, carbon doped oxides, silicon dioxides, silicon nitrides, silicon oxynitrides, OPL, or other dielectric materials that has etch selectivity with respect to lower ILD 150. In an illustrative example, the material of the lower ILD 150 may be silicon oxide ($SiO_2$) and the material of the lower ILD fill 160 may be silicon carbide (SiC), Silicon Oxycarbide (SiOC), or the like. Any known manner of forming the lower ILD fill 160 can be utilized. The lower ILD fill 160 can be formed using, for example, CVD, PECVD, ALD, flowable CVD, spin-on dielectrics, or PVD.

In an example, the lower ILD fill 160 may be formed to a thickness above the top surface of the lower ILD 150. Subsequently, a planarization process, such as a CMP, may be performed to remove excess lower ILD fill 160 material. The CMP may create a substantially planar or substantially horizontal top surface for the semiconductor IC device 100. In other words, the respective top surfaces of the lower ILD fill 160, lower ILD 150, lower gate spacers, lower sacrificial gates, etc. may be substantially coplanar and/or substantially horizontal.

For clarity, the lower ILD fill 160 may be formed within the lower S/D region cut opening 152 and within the void formed by the lateral recess of the lower S/D region 141, generally around the one or more protrusion portion(s) 156 of the lower ILD 150. Therefore, at the present fabrication stage(s), the previously unsupported two or more sides of the one or more protrusion portion(s) 156 may be generally supported or in direct contact with the lower ILD fill 160.

Figure 9:
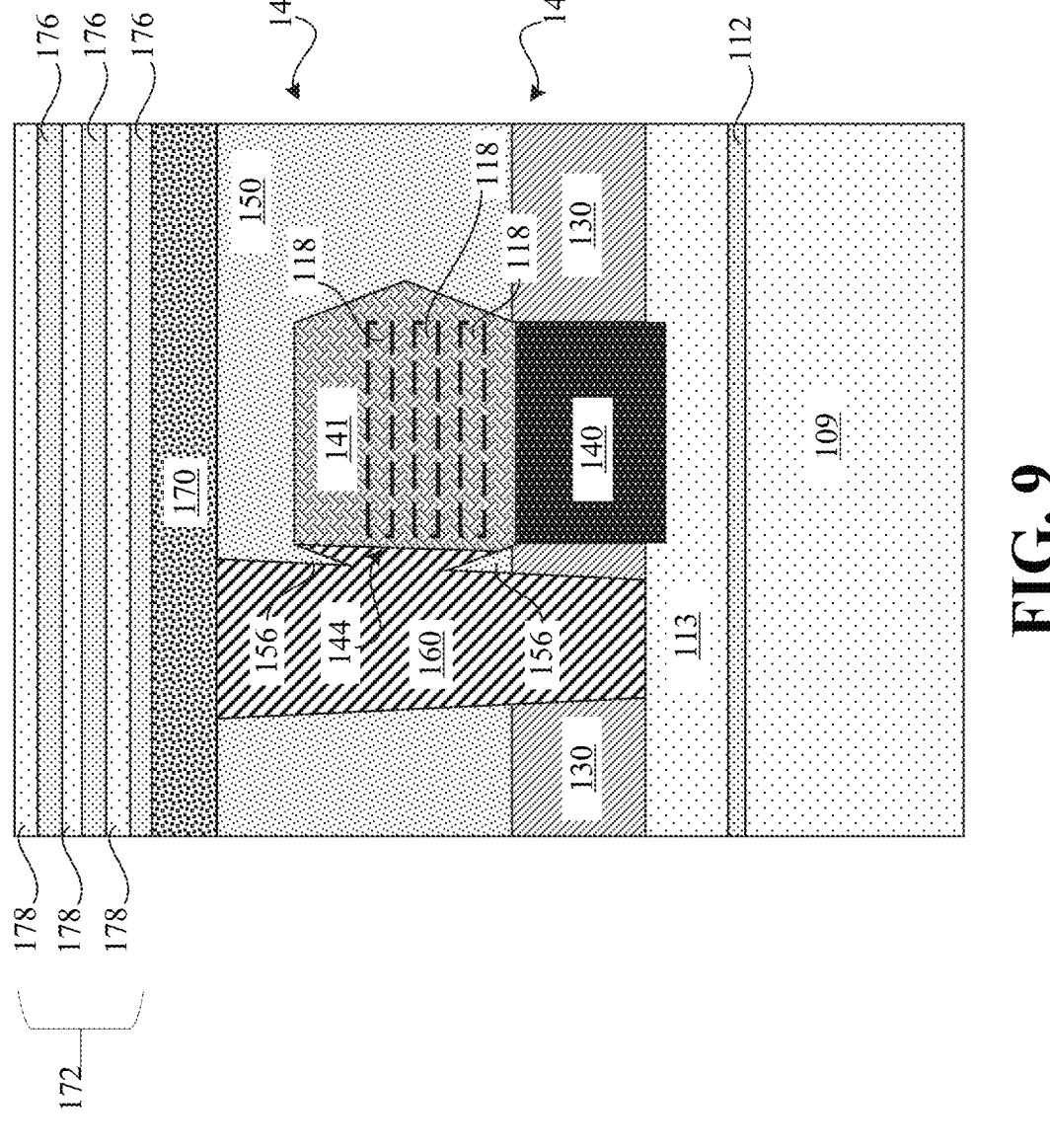

FIG. 9 depicts cross-sectional views of semiconductor IC device 100 shown after representative fabrication operation(s), in accordance with one or more embodiments. In the depicted fabrication stage, top transistor nanolayers may be bonded.

For example, top transistor nanolayers 172, which includes alternating active nanolayers 178 and sacrificial nanolayers 176 may be bonded to the semiconductor IC device 100 of FIG. 8 by a bonding layer 170. In such process, a second wafer that includes a second substrate (not shown) and the top transistor nanolayers 172, formed upon the second wafer, may be bonded to the wafer associated with the substrate structure 110. The two wafers may be bonded by bonding layer 170, which may be e.g., a bonding oxide. After wafer-to-wafer bonding, the second substrate may be removed, and the top transistor nanolayers 172 are retained and bonded to the wafer associated with the substrate structure 110 by bonding layer 170.

In the example illustrated, there are a total of three sacrificial nanolayers 176 and three active nanolayers 178 that are alternately formed to create the top transistor nanolayers 172. However, it should be appreciated that any suitable number of alternating layers may be formed. Although it is specifically contemplated that the sacrificial nanolayers 176 can be formed from SiGe and that the active nanolayers 178 can be formed from Si, it should be understood that any appropriate materials can be used instead, as long as the two semiconductor materials have etch selectivity with respect to one another.

In certain embodiments, the sacrificial nanolayers 176 have a vertical thickness ranging, for example, from approximately 3 nm to approximately 20 nm. In certain embodiments, the active nanolayers 178 have a vertical thickness ranging, for example, from approximately 3 nm to approximately 10 nm. Although the range of 3-20 nm is cited as an example range of thickness, other thickness of these layers may be used. In certain examples, certain of the sacrificial nanolayers 176 or the active nanolayers 178 may have different thicknesses relative to one another. Therefore, multiple epitaxial growth processes can be performed to form the alternating top transistor nanolayers 172.

In certain embodiments, it may be desirable to have a VSP between adjacent top transistor nanolayers 172 to reduce the parasitic capacitance and to improve circuit speed. For example, the VSP (the distance between adjacent active nanolayers 178) may range from 5 nm to 15 nm. However, the VSP should be of sufficient value to accommodate the replacement gate that will be formed in the spaces created by later removal of respective portions of the sacrificial nanolayers 176.

Figure 10:
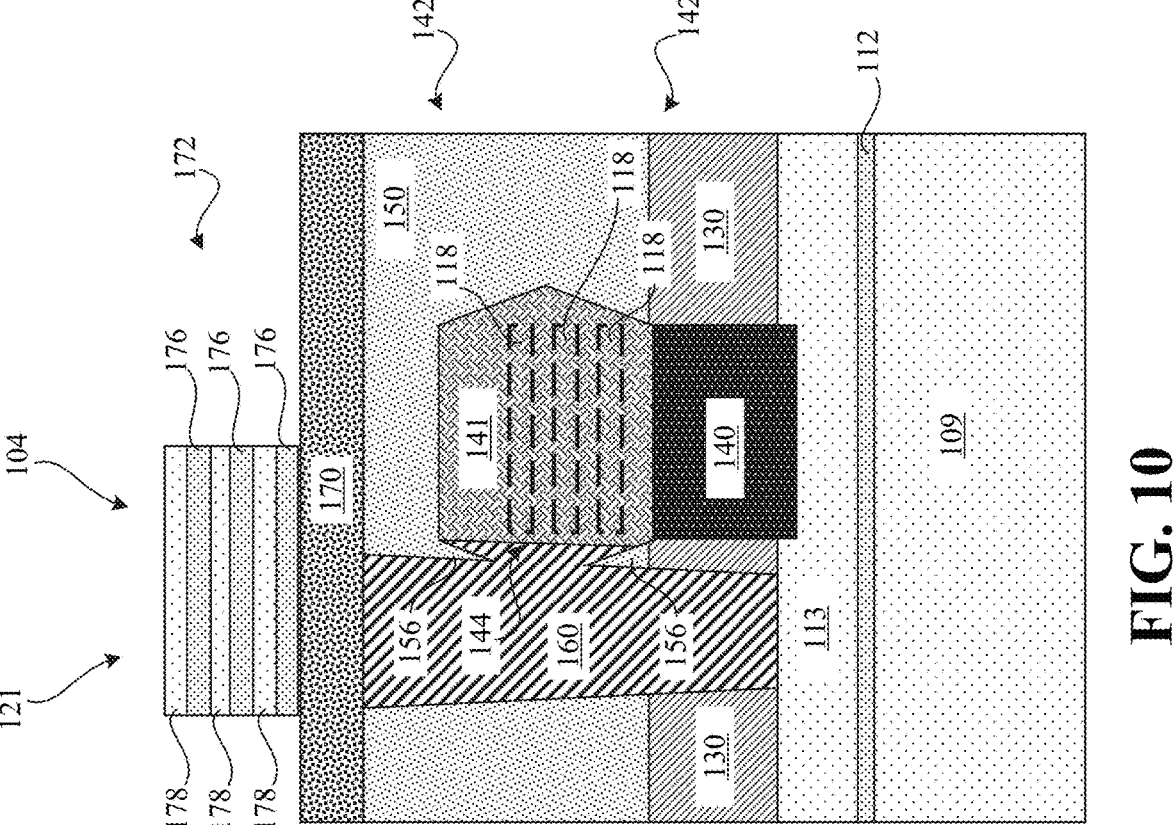

FIG. 10 depicts cross-sectional views of semiconductor IC device 100 shown after representative fabrication operation(s), in accordance with one or more embodiments. In the depicted stages, the top transistor nanolayers may be patterned into nanolayer stacks.

For example, the top transistor nanolayers 172 may be patterned into nanolayer stacks 121. To form one or more nanolayer stacks 121, a mask layer (not shown) may be formed on the uppermost nanolayer of the top transistor nanolayers 172. The mask layer may be comprised of any suitable mask material(s). The mask layer may be patterned and used to perform the nanolayer stack 121 patterning process. In the nanolayer stack 121 patterning process, any suitable material removal process (e.g., reactive ion etching or RIE) may be used to remove portions of the alternating top transistor nanolayers 172 down to the level of the bonding layer 170, or the like. Following the nanolayer stack 121 patterning process, one or more nanolayer stacks 121 are formed. Subsequently, the mask layer may be removed. A horizontal width of a first nanolayer stack 121 may define a horizontal dimension (e.g., left to right) and a perpendicular horizontal dimension (e.g., into and out of the page) of upper transistor active region 104.

Figure 11:
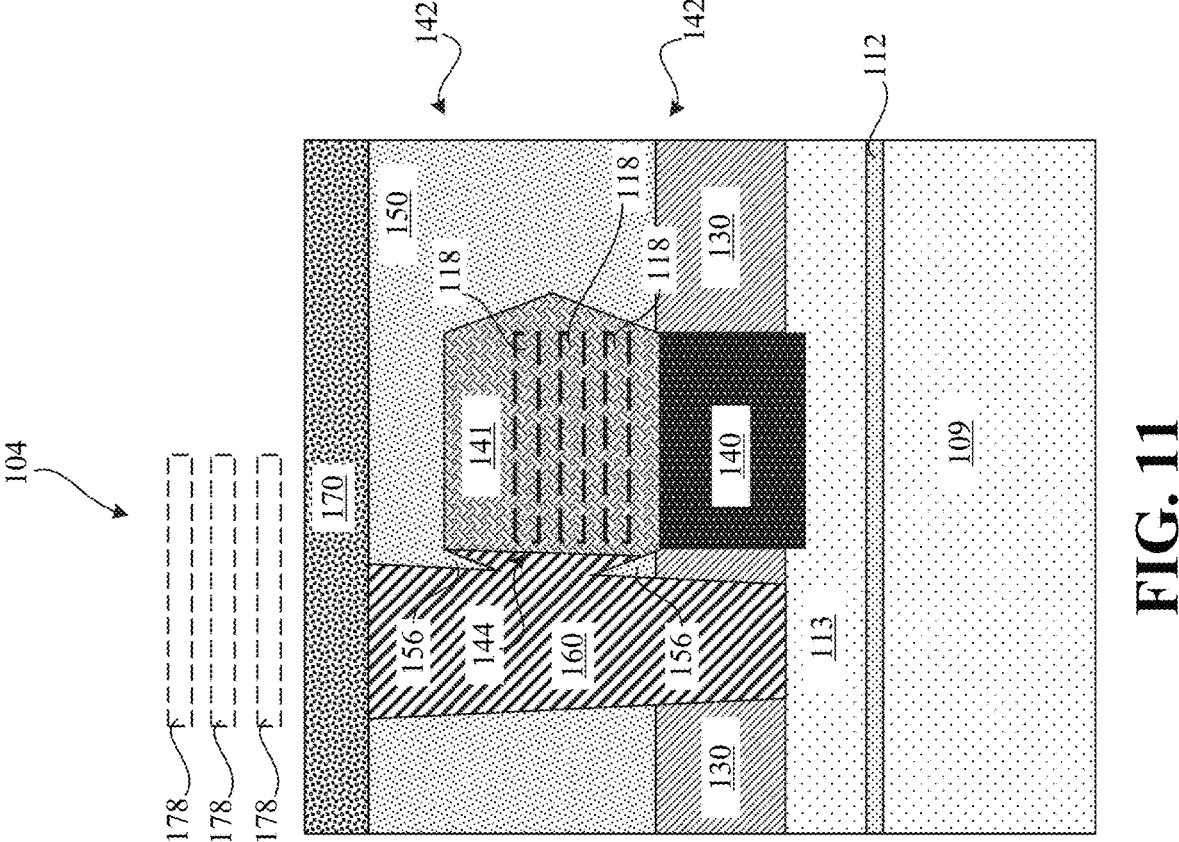

FIG. 11 depicts cross-sectional views of the semiconductor IC device 100 after fabrication operations, in accordance with embodiments of the present disclosure. In the depicted fabrication stages, one or more upper sacrificial gate structures (not shown) may be formed. Further in the depicted fabrication stages, upper gate spacers (not shown) may be formed. Further in the depicted fabrication stages, the upper sacrificial nanolayers may be indented and a respective upper inner spacer (not shown) may be formed within respective indents.

In the depicted fabrication stages, one or more upper sacrificial gate structures (not shown) may be formed over the one or more nanolayer stacks 121 and may include an upper sacrificial gate liner (not shown), a upper sacrificial gate (not shown), and a upper sacrificial gate cap (not shown). The upper sacrificial gate structures may be formed by initially depositing an upper sacrificial gate liner layer (e.g., a dielectric, oxide, or the like) upon the bonding layer 170 and upon and around the one or more nanolayer stacks 121. The upper sacrificial gate structures may further be formed by subsequently depositing an upper sacrificial gate layer (e.g., amorphous silicon, or the like) upon the upper sacrificial gate liner layer. The thickness of the upper sacrificial gate layer may be such that the top surface of the upper sacrificial gate layer is above the top surface of the one or more nanolayer stacks 121. The upper sacrificial gate structures may further be formed by forming a gate cap layer upon the upper sacrificial gate layer. The gate cap layer may be formed by depositing a mask material, such as a hard mask material, such as silicon nitride, silicon oxide, combinations thereof, or the like, upon the upper sacrificial gate layer. The gate cap layer may be composed of one or more layers of masking materials to protect the upper sacrificial gate layer and/or other underlying materials during subsequent processing of semiconductor IC device 100.

The one or more upper sacrificial gate structures may further be formed by patterning the gate cap layer, upper sacrificial gate layer, and upper sacrificial gate liner by, for example, using lithography and etch processes to remove undesired portions and retain desired portion(s), respectively. The retained portion(s) of the gate cap layer, upper sacrificial gate layer, and upper sacrificial gate liner may form the upper sacrificial gate liner (not shown), the upper sacrificial gate (not shown), and the upper sacrificial gate cap (not shown), respectively, of each of the one or more upper sacrificial gate structures.

One or more upper sacrificial gate structures can be formed on targeted regions or areas of semiconductor IC device 100 to define the gate length of one or more upper transistors and to provide sacrificial material for yielding targeted upper transistor structure(s) in subsequent processing. In embodiments, a respective upper sacrificial gate structure may be formed inline with a particular lower sacrificial gate structure.

Further in the depicted fabrication stages, upper gate spacers (not shown) may be formed. The upper gate spacer(s) may be formed upon the sidewall(s) of the upper sacrificial gate structures, upon the bonding layer 170, and around the one or more nanolayer stacks 121. The upper gate spacer(s) may be formed by a conformal deposition of a dielectric material, such as silicon nitride, SiBCN, SiNC, SiN, SiCO, SiNOC, or a combination thereof, or the like, upon bonding layer 170, upon and around the one or more upper sacrificial gate structures, and upon and around the one or more nanolayer stack(s) 121. Subsequently, undesired portions of dielectric material may be removed while desired portions the dielectric material may be retained and thereby form the upper gate spacer(s). The undesired portions of dielectric material may be removed by a directional ion etch, such as a reactive ion etch (RIE).

Further in the depicted fabrication stages, upper source/drain (S/D) recesses may be formed within the one or more nanolayer stacks 121 between upper gate spacers of neighboring upper sacrificial gate structures. In other words, a single nanolayer stack 121 may be separated, by an upper S/D recess, into multiple nanolayer stacks 121 each located underneath a respective upper sacrificial gate structure. The one or more upper S/D recesses may be formed between adjacent upper sacrificial gate structures by removing respective portions of the sacrificial nanolayers 176 and active nanolayers 178 (shown in FIG. 10), that are between upper gate spacers of adjacent or neighboring upper sacrificial gate structures. The one or more upper S/D recesses may be formed to a depth to stop at the top surface of the bonding layer 170, or the like.

The undesired portions of sacrificial nanolayers 176 and active nanolayers 178 may be removed by etching or other subtractive removal techniques. The top surface of the bonding layer 170 may be used as an etch stop or other etch parameters may be controlled to stop the material removal at the bonding layer 170. As the upper gate spacers and the upper sacrificial gate structures may be utilized to protect the underlying portions of sacrificial nanolayers 176, active nanolayers 178, respective sidewalls of the nanolayer stacks 121 may be substantially coplanar and substantially vertical with the outer sidewalls of the upper gate spacers, there above.

Further in the depicted fabrication stages, sacrificial nanolayers 176 may be indented and a respective upper inner spacer may be formed in each indent. For example, horizontal or lateral indents may be formed by laterally or horizontally (e.g., into and/or out of the page of the depicted Y1 cross-section) removing respective portions of sacrificial nanolayers 176 within the nanolayer stacks 121. The indents may be formed by a reactive ion etch (RIE) process, which can remove portions of the sacrificial nanolayers 176. The horizontal depth of the indents may be chosen to set a length for a replacement gate structure that is formed in place of one upper sacrificial gate structure. When the sacrificial nanolayers 176 are composed of SiGe and when active nanolayers 178 are Si, the directional RIE can use a boron-based chemistry or a chlorine-based chemistry, for example, which recesses or removes the exposed end portions of sacrificial nanolayers 176 (e.g., end portions of sacrificial nanolayers 176 generally below the gate spacer) selective to the Si active nanolayers 178. In alternative implementations when sacrificial nanolayers 176 are not SiGe and when active nanolayers 178 are not Si, the directional etch of the sacrificial nanolayers 176 may generally be selective to the active nanolayers 178, upper gate spacers, and/or bonding layer 170.

Further in the depicted fabrication stages, a respective upper inner spacer (not shown) is formed within each indent. The one or more upper inner spacers can be formed by ALD or CVD or any other suitable deposition technique that deposits a dielectric material within the indent(s), thereby forming the upper inner spacer(s). In some examples, the upper inner spacer(s) are composed of a low-κ dielectric material, SiN, SiO, SiBCN, SiOCN, SiCO, etc. or any other suitable dielectric material. In certain implementations, after the formation of the upper inner spacer(s), an isotropic etch process is performed to create substantially vertical sidewalls of the upper inner spacer(s) that are coplanar with the substantially vertical sidewalls of the active nanolayers 178, of the upper gate spacers, or the like.

Figure 12:
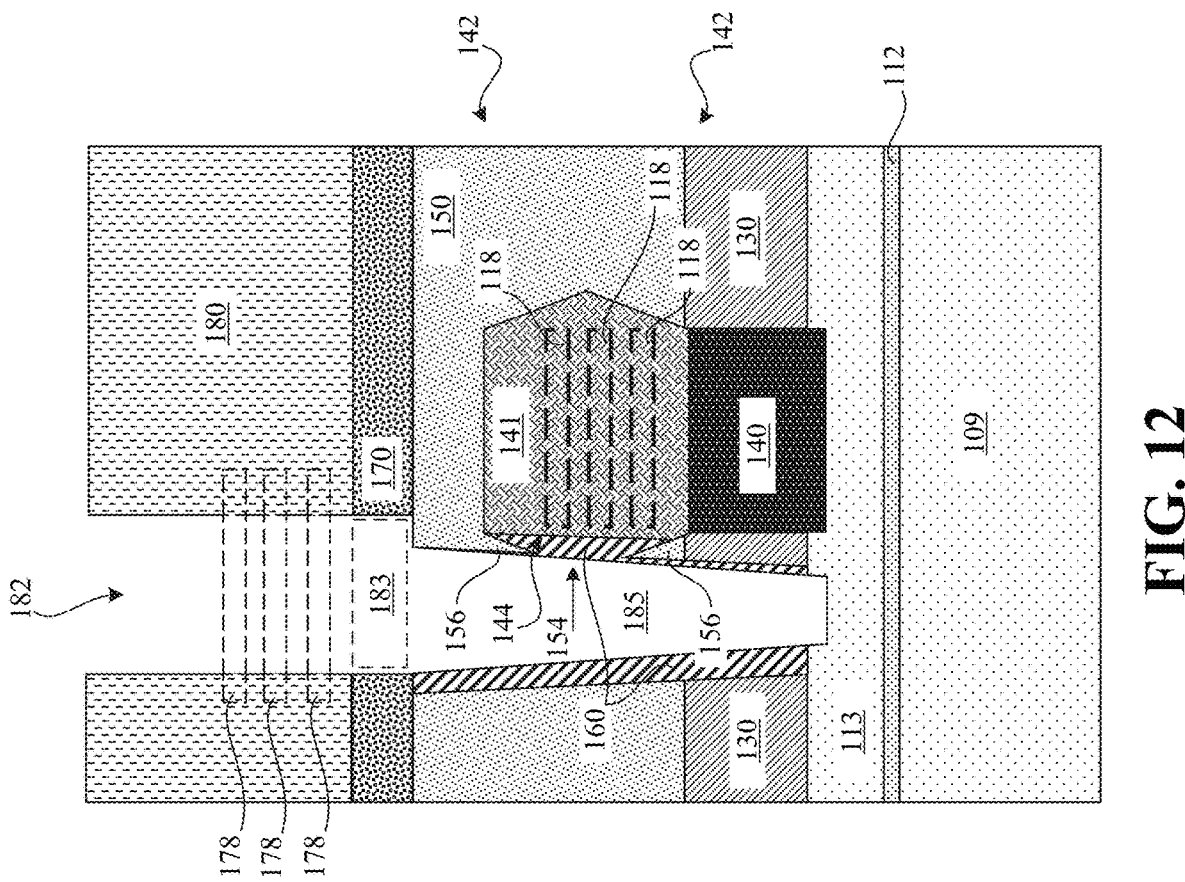

FIG. 12 depicts cross-sectional views of the semiconductor IC device 100 after fabrication operations, in accordance with embodiments of the present disclosure. In the depicted fabrication stages, an upper transistor backside contact placeholder opening may be formed. For example, upper transistor backside contact placeholder opening 182 is formed.

The upper transistor backside contact placeholder opening 182 may be formed by depositing a mask 180 material, such as a mask material, organic planarization layer (OPL), or the like. An opening in the patterned mask 180 may expose the portion of the underlying bonding layer 170 that is to be removed while other protected portions of bonding layer 170 thereunder may be protected and retained by the mask 180. One or more etching processes may remove the exposed portion of the bonding layer 170 (thus forming an opening 183 within the bonding layer 170).

Subsequently, a self-aligned etch process may then remove portions of the lower ILD fill 160 below the opening 183 selective to the lower ILD 150. As is illustratively depicted, portions of the ILD fill 160 may remain upon sidewall(s) of the lower ILD 150 and STI region(s) 130 within the upper transistor backside contact placeholder opening 182. Alternatively, the ILD fill 160 may be removed from the sidewall(s) of the lower ILD 150 and/or and STI region(s) 130 within the upper transistor backside contact placeholder opening 182 while a portion of the ILD fill 160 is retained that is against the recessed sidewall 144 within the horizontal or lateral indent 154.

For clarity, after formation of the upper transistor backside contact placeholder opening 182, by the removal of portions of the bonding layer 170 (thus forming an opening 183 within the ILD fill 160) and removal of at least portions of the ILD fill 160 (thus forming an opening 185 within the ILD fill 160), a portion of the ILD fill 160 that is against the recessed sidewall 144 within the horizontal or lateral indent 154 is retained. For example, the portion of the ILD fill 160, that is against the recessed sidewall 144 and between protrusion portion(s) 156 of lower ILD 150, may be retained. This retained portion of the ILD fill 160 may later adequately electrically isolate the lower S/D region 141 from the upper transistor backside contact 206, shown in FIG. 17.

The etching process(es) can have etching parameters that can be tuned, such as etchants used, etching temperature, etching solution concentration, etching pressure, source power, RF bias voltage, RF bias power, etchant flow rate, to promote desired material removal and desired material retention. In the illustrated example, the etching processes may form a depth of the upper transistor backside contact placeholder opening 182 such that a well of this opening 182 is formed within the substrate structure 110. For clarity, in some embodiments, the etch utilized to form the upper transistor backside contact placeholder opening 182 may remove the material of the ILD fill 160 selective to the respective materials of the lower ILD 150, STI region(s) 130, or the like.

For clarity, and as illustrated, the opening 183 may have a larger circumference, diameter, or the like, relative to the largest circumference, diameter, or the like of the opening 185. The relatively larger size of the opening 183 may provide for an adequately large backside contact placeholder surface from which to grow the formation of the upper S/D region thereupon and ultimately may provide for a relative larger interface (i.e., lower interfacial resistance) between the upper transistor backside contact 206, shown in FIG. 17, and the upper S/D region 192, shown in FIG. 13. Subsequently, the mask 180 may be removed by a subtractive removal technique, such as an etch, OPL ash, or the like.

Figure 13:
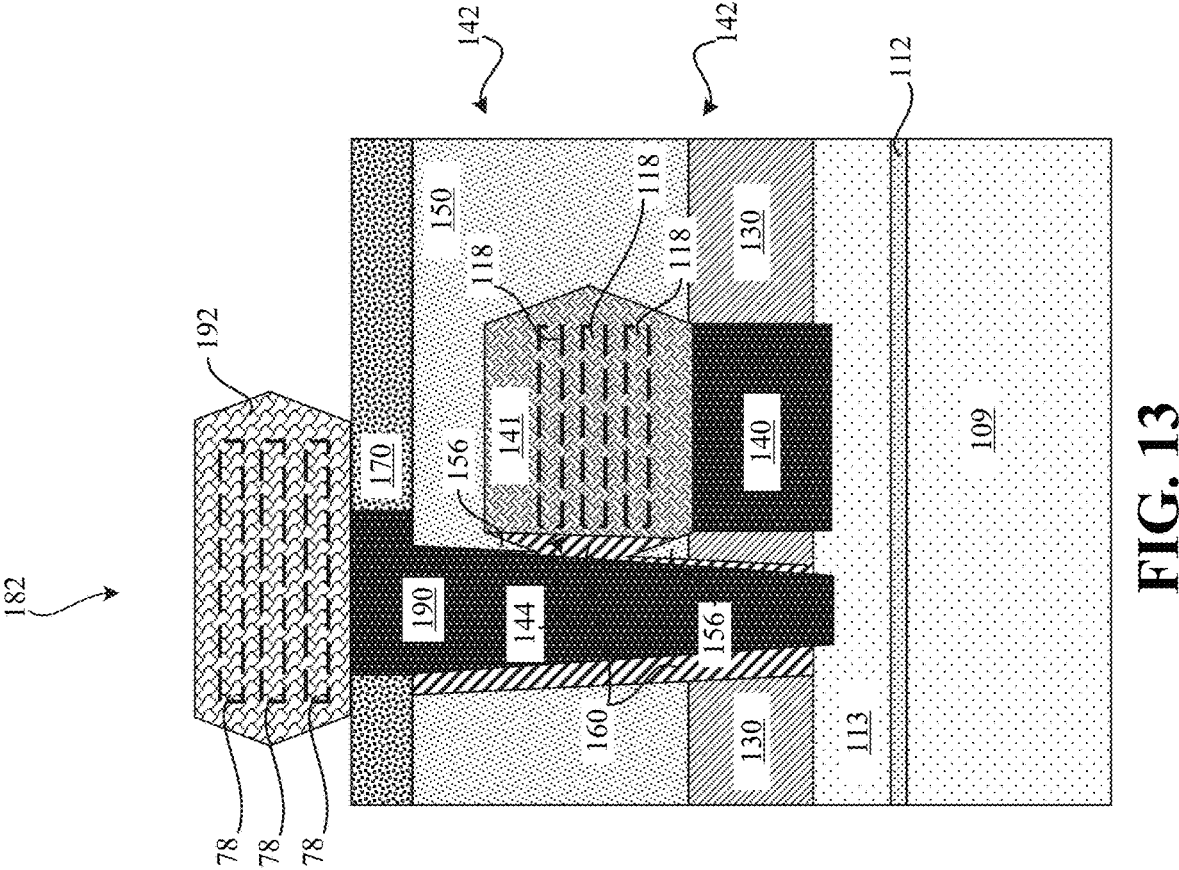

FIG. 13 depicts cross-sectional views of the semiconductor IC device 100 after fabrication operations, in accordance with embodiments of the present disclosure. In the depicted fabrication stages, an upper transistor backside contact placeholder may be formed within the upper transistor backside contact placeholder opening. Further in the depicted fabrication stages, an upper S/D region may be formed upon a respective upper transistor backside contact placeholder.

For example, one upper transistor backside contact placeholder 190 may be formed within an upper transistor backside contact placeholder opening 182 that is located between adjacent upper sacrificial gate structures. In one example, one or more upper transistor backside contact placeholders 190 may be formed only in locations in which a backside contact, such as backside contact 206 depicted in FIG. 17, or the like, is to be formed. In an alternative example upper transistor backside contact placeholder 190 may be formed in each upper transistor S/D region location.

The one or more upper transistor backside contact placeholder 190 may be further formed by epitaxially growing an epitaxial material from exposed substrate structure 110 surface(s) within the one or more upper transistor backside contact placeholder openings 182, respectively. In some embodiments, epitaxial growth and/or deposition processes may be selective to forming on the semiconductor surfaces of the upper substrate 113, and may not grow material from dielectric surfaces, such as silicon dioxide or silicon nitride surfaces. In some embodiments, the epitaxial growth of the one or more upper transistor backside contact placeholder 190 may overgrow above the top surface of the bonding layer 170. In an example, the epitaxial material of the one or more upper transistor backside contact placeholders 190 may be chosen to be etch selective to the material of the ILD fill 160.

Figure 20:
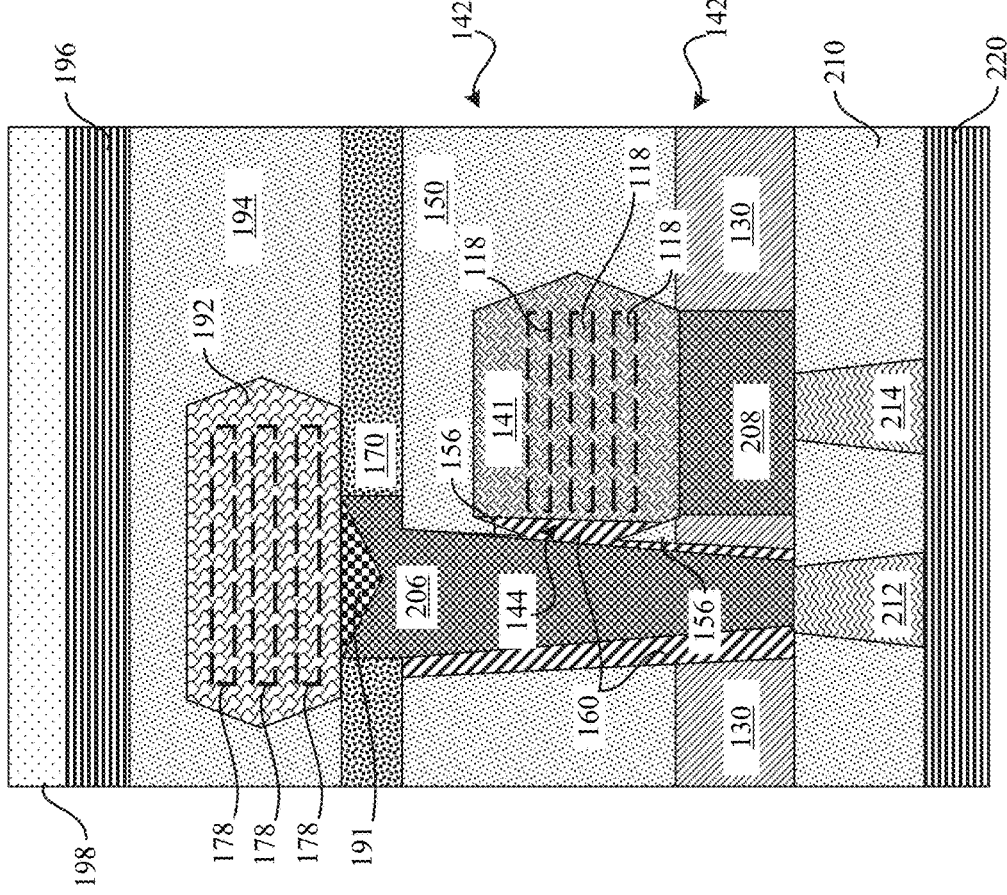

In an example, an etch stop layer (such as a trench epi region 191, as depicted in FIG. 20) (e.g., a Si epitaxially grown layer, or the like) may be formed upon the top surface (or etched top surface) of the upper transistor backside contact placeholders 190. For example, the one or more upper transistor backside contact placeholders 190 may be SiGe and a Si etch stop layer may be epitaxially grown from the top surface of the SiGe upper transistor backside contact placeholders 190. Respective top surfaces of the upper transistor backside contact placeholders 190 (or etch stop layer thereupon) may be substantially horizontal and below the bottom surface of the bottommost active nanolayer 178 (e.g., to enable contact between such active nanolayer 178 and the upper S/D region 192).

Further in the depicted fabrication stages, a respective upper S/D region 192 is formed upon a respective upper transistor backside contact placeholder 190. The upper S/D region 192 forms either a source or a drain, respectively, of respective upper transistor, such as a GAA FET, and is connected to respective a side or end surface of the active nanolayers 178 of the upper nanolayer stack 121. The upper S/D region 192 is composed of a semiconductor material and a dopant. The semiconductor material that provides each upper S/D region 192 is composed of one of the semiconductor materials mentioned above for the semiconductor structure. The semiconductor material that provides the upper S/D region 192 can be compositionally the same, or compositionally different from each active nanolayers 178. The dopant that is present in the upper S/D region 192 can be either a p-type dopant or an n-type dopant. In one example, each upper S/D region 192 can have a dopant concentration of from $4\times113^0$ atoms/cm$^3$ to $3\times113^1$ atoms/cm$^3$.

The one or more upper S/D regions 192 may be epitaxially grown or formed and may, therefore, include one or more diamond surfaces (e.g., the upper S/D region 192 may have one or more (111) orientated diamond like crystallographic surfaces, as depicted). In some examples, the upper S/D regions 192 are formed by in-situ doped epitaxial growth. The use of an in-situ doping process is merely an example. For instance, one may instead employ an ex-situ process to introduce dopants into the source and drains. Other doping techniques can be used to incorporate dopants in the upper source/drain region 192. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In examples, the S/D epitaxial growth conditions that promote in-situ Boron doped SiGe for p-type transistor and phosphorus or arsenic doped silicon or Si:C for n-type transistors.

In some examples, the epitaxial growth that forms the one or more upper S/D region 192 occurs or is promoted from the upper surface of upper transistor backside contact placeholder 190 (or etch stop layer thereupon), while epitaxial growth is limited or does not occur from neighboring bonding layer 170.

In some embodiments, epitaxial growth to form the one or more upper S/D regions 192 may overgrow above the upper surface of the upper sacrificial gate structure(s) and be subsequently recessed such that the top surface of the upper S/D region 192 may be substantially horizontal and above the top surface of the topmost active nanolayer 178 within the nanolayer stacks 121 (e.g., to enable contact between this active nanolayer 178 and the upper S/D region 192).

Figure 14:
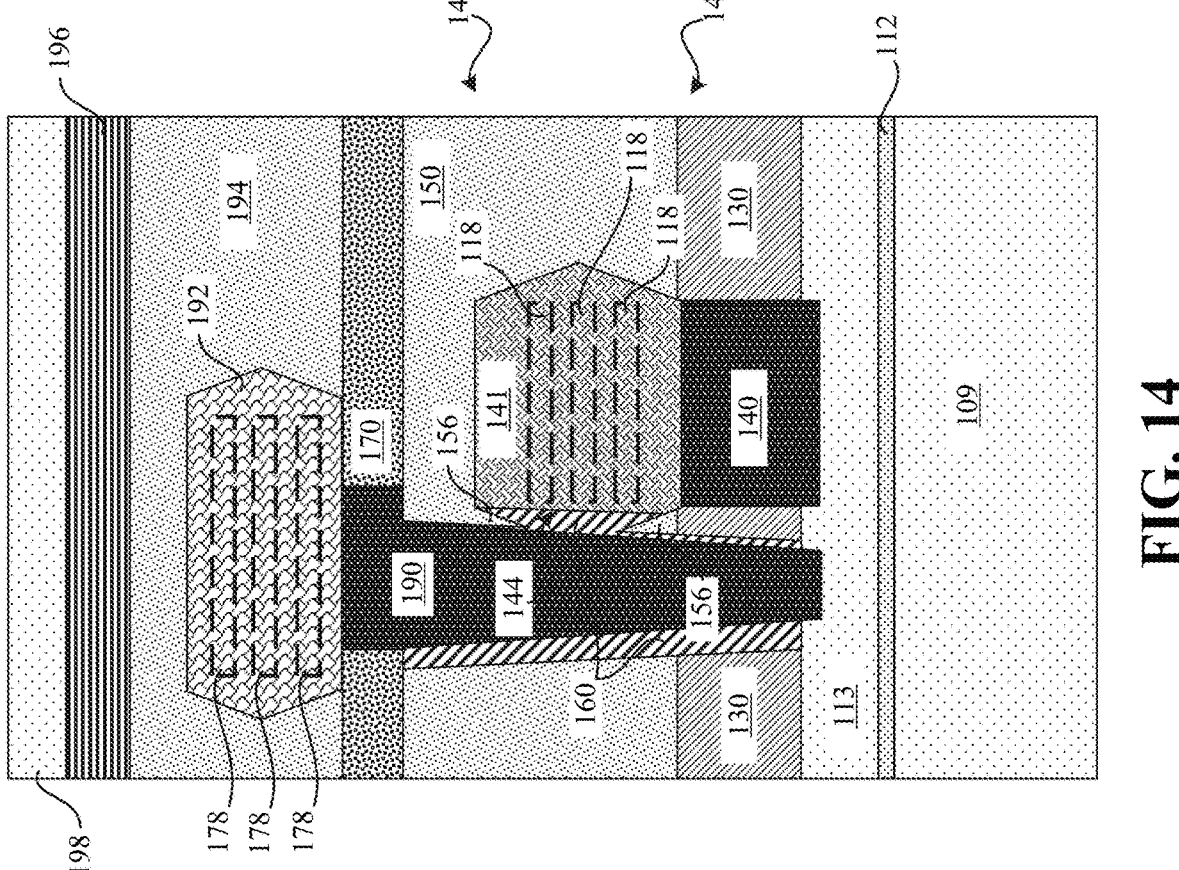

FIG. 14 depicts cross-sectional views of the semiconductor IC device 100 after fabrication operations, in accordance with embodiments of the present disclosure. In the depicted fabrication stages, an upper S/D region may be formed upon a respective upper transistor backside contact placeholder. Further, in the depicted fabrication stages, an upper ILD and upper gate cut regions may be formed. Further, in the depicted fabrication stages, the upper sacrificial gate structures may be patterned to expose the underlying lower sacrificial gate structures. Further, in the depicted fabrication stages, the upper sacrificial gate structures and the lower sacrificial gate structures may be removed and replacement upper sacrificial gate structures and replacement lower sacrificial gate structures may be formed. Further, in the depicted fabrication stages, a frontside contact ILD may be formed and one or more frontside contacts may be formed. Further, in the depicted fabrication stages, a frontside BEOL network may be formed and a carrier wafer may be bonded thereto.

For example, an upper interlayer dielectric (ILD) 194 may be formed. For example, a blanket upper ILD 194 material may be deposited over the upper S/D region(s) 192, over the bonding layer 170, over the upper sacrificial gate structures, and over the upper gate spacers associated with adjacent upper sacrificial gate structures.

The upper ILD 194 can be any suitable material, such as, for example, porous silicates, carbon doped oxides, silicon dioxides, silicon nitrides, silicon oxynitrides, OPL, or other dielectric materials. Any known manner of forming the upper ILD 194 can be utilized. The upper ILD 194 can be formed using, for example, CVD, PECVD, ALD, flowable CVD, spin-on dielectrics, or PVD.

In an example, the upper ILD 194 may be formed to a thickness above the top surface of the upper sacrificial gate structures. Subsequently, a planarization process, such as a CMP, may be performed to remove excess upper ILD 194 material and to remove the upper sacrificial gate caps of the upper sacrificial gate structures, thereby exposing the upper sacrificial gate thereunder. The planarization may also partially remove some of the upper sacrificial gates or may at least expose the upper sacrificial gate of the upper sacrificial gate structures. The CMP may create a substantially planar or substantially horizontal top surface for the semiconductor IC device 100. In other words, the respective top surfaces of the upper ILD 194, upper gate spacers or upper sacrificial gates, etc. may be substantially coplanar and/or substantially horizontal.

Upper gate cut region(s) (not shown) may be formed within the upper sacrificial gate structures. For example, a gate cut opening may be formed within the upper sacrificial gate structure in between associated upper gate spacer(s). The gate cut opening may expose an upper surface of a portion of the gate liner, an upper surface of a portion of the bonding layer 170, or the like.

The gate cut opening may be formed by lithography and etch process, where a mask may be applied and patterned. An opening in the patterned mask may expose the portion of the underlying upper sacrificial gate structure to be removed while other protected portions of the upper sacrificial gate structure thereunder may be protected and retained. Upper gate cut region(s) may be further formed by depositing dielectric material such as silicon nitride (SiN), a combination of SiN and Silicon Dioxide (SiO$_2$), or the like, within the gate cut opening. Subsequently, excess mask material and/or excess upper gate cut region material may be removed and planarized by e.g., a CMP. As such, respective top surfaces the upper sacrificial gate structure, upper gate spacer(s), and upper gate cut region(s) may be coplanar.

Further, in the depicted fabrication stages, the upper sacrificial gate structures may be patterned to expose the underlying lower sacrificial gate structures. For example, one or more replacement gate opening(s) (not shown) may be formed within the upper sacrificial gate structure(s) and expose a respective portion(s) of lower sacrificial gate structure(s).

The one or more replacement gate opening(s) may be formed by lithography and etch process, where a mask (not shown) may be applied and patterned. An opening in the patterned mask may expose the portion of the underlying upper sacrificial gate structure to be removed between upper gate spacers, while other protected portions of upper sacrificial gate structure thereunder may be protected and retained. The one or more replacement gate opening(s) may be formed to a depth through bonding layer 170 to expose at least a portion of the lower upper sacrificial gate structure(s). For example, the etch utilized to remove the unprotected portion(s) of upper sacrificial gate structure(s) and respective portion(s) of bonding layer 170, there below, is timed to stop at or within the lower upper sacrificial gate structure(s).

Further, in the depicted fabrication stage(s), the upper sacrificial gate structures and the lower sacrificial gate structures may be removed which may form a replacement gate structure opening. The upper sacrificial gate structures and the lower sacrificial gate structures may be removed by a selective etch of the upper gate and lower gate material through the one or more replacement gate opening(s).

After the removal of the sacrificial gate structures, there are void spaces between the retained active semiconductor nanolayers 118 and 178. Therefore, the active semiconductor nanolayers 118 and 178 may be referred to as released. It should be appreciated that during the removal of the sacrificial gate structures appropriate etchants are used that do not significantly remove material of active semiconductor nanolayers 118 and 178, bonding layer 170, upper and lower gate spacers, upper and lower inner spacers, and upper and lower gate cut region(s), or the like.

Further, at the present stages of fabrication, replacement gate structure(s) (not shown) are formed in place of the removed lower sacrificial gate structure(s) around one or more active semiconductor nanolayers 118 and in place of the removed upper sacrificial gate structure(s) around the released active semiconductor nanolayers 178. For clarity, the replacement gate structure may be shared by the upper transistor and the lower transistor (i.e., the same replacement gate structure is around the active semiconductor nanolayers 178 and the active semiconductor nanolayers 118 between respective upper/lower gate cut regions).

A replacement gate structure may be formed by initially forming an interfacial layer (not shown) on the interior surfaces of the replacement gate opening. Then, a high-κ layer (not shown) may be formed to cover the surfaces of exposed surfaces of the interfacial layer. The high-κ layer can be deposited by any suitable techniques, such as ALD, CVD, metal-organic CVD (MOCVD), physical vapor deposition (PVD), thermal oxidation, combinations thereof, or other suitable techniques. A high-κ dielectric material is a material with a higher dielectric constant than that of SiO$_2$, and can include e.g., LaO, AlO, ZrO, TiO, Ta$_2$O$_5$, Y$_2$O$_3$, SrTiO$_3$(STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), or other suitable materials. In other examples, instead of the high-κ layer, a metal layer may be formed to cover the surfaces of exposed surfaces of the interfacial layer. The metal layer may include, e.g., Ti, Ag, Al, TiAlN, TaC, TaCN, TaSiN, Mn, Zr, TiN, TaN, Ru, Mo, Al, WN, Cu, W, or any suitable materials.

The replacement gate structure may be further formed by depositing a work function metal (WFM) gate, which may be referred to herein as replacement gate upon the high-κ layer. The replacement gate can be comprised of metals, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, the height of the replacement gate can be reduced by chemical-mechanical polishing (CMP) and/or etching. Therefore, the planarization process can be provided by CMP. Other planarization process can include grinding and polishing. In general, the replacement gate sets the threshold voltage (Vt) of the upper transistors and the lower transistors. The high-κ layer may separate the replacement gate from the active semiconductor nanolayers 178 and the active semiconductor nanolayers 118. Other metals that may be desired to further fine tune the effective work function (eWF) and/or to achieve a desired resistance value associated with current flow through the replacement gate structure.

Further, in the depicted fabrication stages, a frontside contact ILD and one or more frontside contacts may be formed therewithin.

For example, the frontside contact ILD (depicted as the same material as upper ILD 194) may be formed upon respective top surfaces of replacement gate structure(s), upper ILD 194, upper gate spacer(s), and upper gate cut region(s). The frontside contact ILD may be formed by depositing a dielectric material, such as, for example, porous silicates, carbon doped oxides, silicon dioxides, silicon nitrides, silicon oxynitrides, or other dielectric materials. Any appropriate deposition technique for forming the frontside contact ILD can be utilized. The frontside contact ILD can be formed using, for example, CVD, PECVD, ALD, flowable CVD, spin-on dielectrics, or PVD.

Subsequently, frontside contact(s) (not shown) may be formed by patterning respective frontside contact openings within the frontside contact ILD, upper ILD 194, or the like, from the frontside (i.e., from above the semiconductor IC device 100, as depicted, downward to respective structures thereof). The frontside contact(s) may be in direct or indirect physical and electrical contact and/or may physically meld with respective material(s) of one or more regions of the semiconductor IC device 100. For example, a particular frontside contact may be in direct contact with a replacement gate structure, or the like.

The frontside contact(s) may be formed by initially forming frontside contact opening(s) within the frontside contact ILD, within the upper ILD 194, bonding layer 170, and/or lower ILD 150 (when applicable). The frontside contact opening(s) may be formed by the same or shared lithography and etch process(es), or sequential lithography and etch processes. In such process(es), a mask may be applied and patterned. An opening in the patterned mask may expose the portion of the underlying ILD to be removed while other protected portions of semiconductor IC device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention.

The frontside contact(s) may be further formed by depositing conductive material such as metal into the respective frontside contact opening(s). In an example, frontside contact(s) may be formed by depositing a liner, such as Ni, NiPt or Ti, etc. into the contact opening(s), depositing an adhesion liner, such as TiN, TaN, etc. upon the liner, and by depositing a conductive fill, such as Al, Ru, W, Co, Cu, etc. upon the metal adhesion liner. Subsequently, a planarization process, such as a CMP process or a mechanical grinding process, may remove excess portions of the liner, the metal adhesion liner, and conductive fill. Subsequently, the respective top surfaces of frontside contact(s) and the frontside contact ILD may be coplanar. In embodiments, the frontside contact(s) are fabricated in middle-of-line (MOL) fabrication operations and may be illustrations of MOL frontside contacts.

In the semiconductor IC device fabrication industry, there are three sections referred to in a build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

Figure 17:
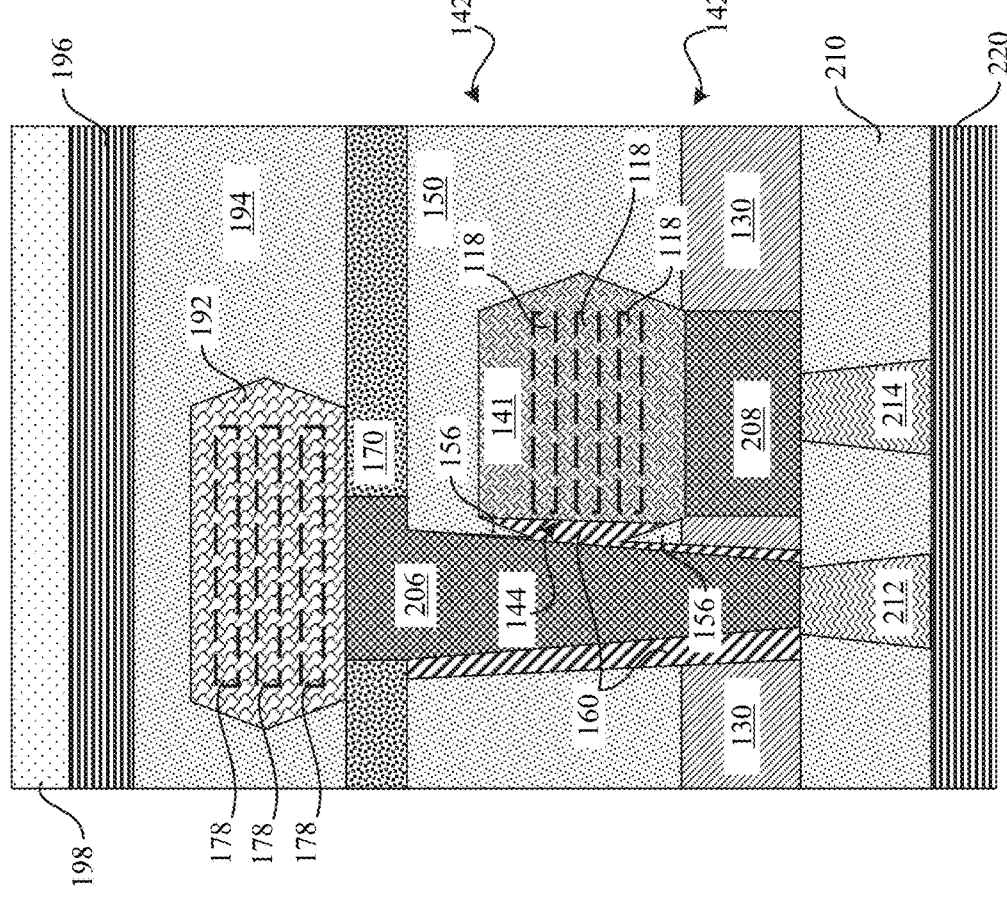

BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than one metal layers may be added in the BEOL. In the present example, there are multiple BEOL networks, each on opposites sides of the semiconductor IC device 100. First, a frontside BEOL network 196 is formed on the frontside of the semiconductor device 100. Subsequently, a backside BEOL network 220, as depicted in FIG. 17 is formed.

In the depicted example, the frontside BEOL network 196 may be formed over the frontside contact ILD and upon frontside contact(s). Respective wires within the frontside BEOL network 196 may be electrically connected to the one or more S/D regions, one or more replacement gate structure(s), or the like, by a respective frontside contact(s) (not shown in FIG. 15). For example, respective wires within the frontside BEOL network 196 may be electrically connected to the lower S/D region 141 by frontside contact 195, as depicted in FIG. 19. Similarly, respective wires within the frontside BEOL network 196 may be electrically connected to one or more replacement gate structure(s), or the like.

The frontside BEOL network 196 may be located directly on the frontside surface of the MOL structure. The frontside BEOL network 196 can include one or more interconnect dielectric material layers (including one of the dielectric materials mentioned above for the upper ILD 194) and contains frontside metal wires (the metal wires can be composed of any electrically conductive metal or electrically conductive metal alloy) embedded therein. In some embodiments, the frontside metal wires within the frontside BEOL network 196 are composed of Cu. The frontside BEOL network 196 can include "x" numbers of frontside metal levels, wherein "x" is an integer starting from 1. The frontside BEOL network 196 may further contain conductive pads that are connected to one or more of the metal wires and may be used to connect the semiconductor IC device to an external and/or higher-level structure, such as a chip carrier, motherboard, or the like.

Subsequently, a carrier wafer 198 that may consist of one of the semiconductor materials mentioned above for the semiconductor structure 110 may be bonded to the frontside BEOL network 196. Carrier wafer 198 may be attached to the semiconductor IC device 100 by a wafer-to-wafer bonding technique.

Figure 15:
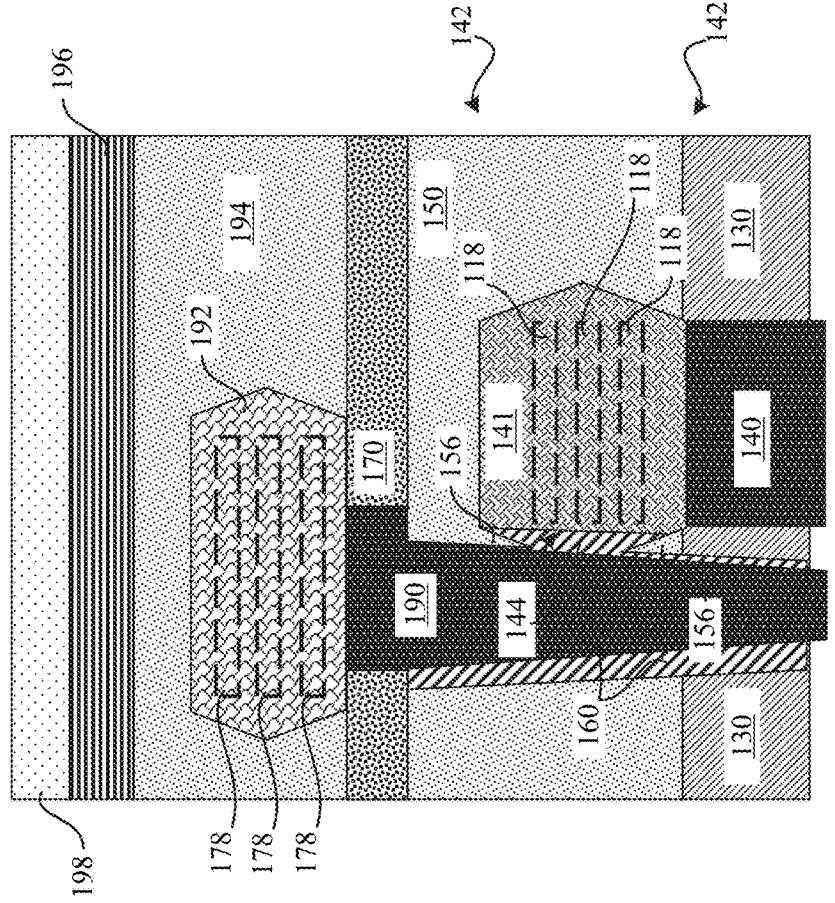

FIG. 15 depicts cross-sectional views of the semiconductor IC device 100 after fabrication operations, in accordance with embodiments of the present disclosure. In the depicted fabrication stages, the substrate structure may be removed.

For example, the substrate structure 110 may be removed by flipping the semiconductor IC device 100 (not shown) and removing the lower substrate 109 using any removal technique, such as a combination of wafer grinding, CMP, dry, and/or wet etch. In the example depicted, lower substrate 109 is removed by an etch that utilizes etch stop layer 112 as the etch stop. In this example, removal of lower substrate 109 exposes the bottom surface of etch stop layer 112.

Subsequently, the remaining substrate structure 110 may be removed. For example, etch stop layer 112 and the upper substrate 113 may be removed.

The etch stop layer 112 may be removed by a selective dry and/or wet etch. Upon removal of the etch stop layer 112, the bottom surface of upper substrate 113 is exposed. The removal of etch stop layer 112 may be selective to the material of upper substrate 113. For example, etch stop layer 112 is removed by an etch that utilizes upper substrate 113 as the etch stop. Subsequently, the upper substrate 113 is removed by an appropriate substrative removal technique, such as an etch, that removes associated portion(s) of the upper substrate 113. The etch may be controlled to remove the material of upper substrate 113 selective to the STI regions 130, selective to the lower S/D region backside contact placeholders 140, selective to the upper S/D region backside contact placeholders 190, and/or selective to the ILD fill 160, or the like. For clarity, respective portions of the upper S/D region backside contact placeholder(s) 190 and the lower S/D region backside contact placeholder(s) 140 may be exposed upon the removal of substrate structure 110. For example, respective bottom surfaces (as depicted) of the upper S/D region backside contact placeholder(s) 190 and the lower S/D region backside contact placeholder(s) 140 may be exposed upon the removal of substrate structure 110.

Figure 16:
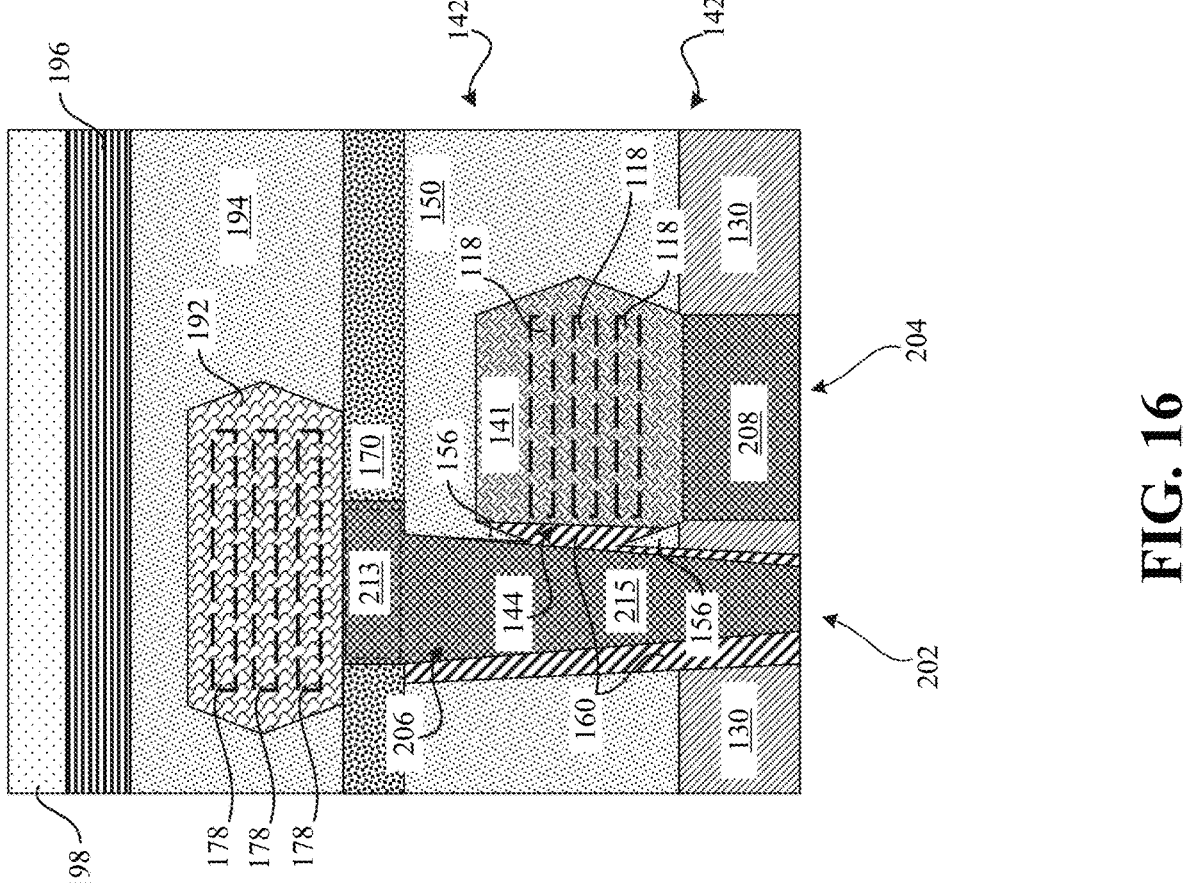

FIG. 16 depicts cross-sectional views of semiconductor IC device 100 shown after exemplary fabrication operation(s), in accordance with one or more embodiments. In the depicted fabrication stages backside contact opening(s) may be formed and an upper S/D region backside contact and a lower S/D region backside contact may be formed therein, respectively.

For example, backside contact opening(s) 202, 204 be formed by the removal of the upper S/D region backside contact placeholder(s) 190 and the lower S/D region backside contact placeholder(s) 140. Subsequently, an upper S/D region backside contact 206 and a lower S/D region backside contact 208 may be formed within backside contact opening(s) 202, 204, respectively.

The backside contact opening(s) 202, 204 may be formed by the same or shared lithography and etch process(es), or sequential lithography and etch processes. In such process(es), an etchant may remove the upper S/D region backside contact placeholder(s) 190 and the lower S/D region backside contact placeholder(s) 140 selective to the ILD fill 160, STI region(s) 130, bonding layer 170, upper S/D region(s), and lower S/D region(s), or the like. These backside contact opening(s) 202, 204 may expose the portion of respective S/D regions there above. In such process(es), the etching process(es) can have etching parameters that can be tuned, such as etchants used, etching temperature, etching solution concentration, etching pressure, source power, RF bias voltage, RF bias power, etchant flow rate, to promote desired material removal and desired material retention.

In the depicted example, the backside contact opening(s) 202 is formed by the removal of upper S/D region backside contact placeholder(s) 190. This backside contact opening 202 exposes the and/or partially removes a portion of a respective upper S/D region 192 there above (as depicted). Similarly, the backside contact opening(s) 204 is formed by the removal of lower S/D region backside contact placeholder(s) 140. This backside contact opening 204 exposes the and/or partially removes a portion of a respective lower S/D region 141 there above (as depicted).

Further in the depicted fabrication stage, upper S/D region backside contact 206 and lower S/D region backside contact 208 may be formed within a backside contact opening(s) 202, 204, respectively. The upper S/D region backside contact 206 and lower S/D region backside contact 208 may be formed by depositing conductive material, such as metal, into the respective backside contact opening(s) 202, 204. In this manner, the upper S/D region backside contact 206 is self-aligned to the upper S/D region 192 connected thereto and the lower S/D region backside contact 208 is self-aligned to the lower S/D region 141 connected thereto.

In an example, the upper S/D region backside contact 206 and lower S/D region backside contact 208 may be formed by depositing a liner, such as Ni, NiPt or Ti, etc. into the backside contact opening(s) 202, 204, depositing an adhesion liner, such as TiN, TaN, etc. upon the liner, and by depositing a conductive fill, such as Al, Ru, W, Co, Cu, etc. upon the adhesion liner.

Subsequently, a planarization process, such as a CMP process or a mechanical grinding process, may remove excess portions of the upper S/D region backside contact 206 and lower S/D region backside contact 208, may remove excess portions of STI region(s) 130, may remove excess portions of the ILD fill 160, or the like. Therefore, respective bottom surfaces (as depicted) of the upper S/D region backside contact 206, the lower S/D region backside contact 208, the STI region(s) 130, and the ILD fill 160 may be substantially coplanar and/or substantially horizontal.

For clarity, and as illustrated, the upper S/D region backside contact 206 may have a portion 213, that is associated with opening 183 (shown in FIG. 12) that has a larger perimeter, circumference, diameter, or the like, relative to the largest perimeter, circumference, diameter, or the like of a portion 215, that is associated with opening 185 (also shown in FIG. 12). The relatively larger size of the portion 213 may provide for a relative larger interface and, therefore, a lower interfacial resistance, between the upper transistor backside contact 206 and the upper S/D region 192. In an example, as illustrated, a sidewall of the portion 213 may be inset within a perimeter of the lower S/D region 141 there below.

FIG. 17 depicts cross-sectional views of semiconductor IC device 100 shown after exemplary fabrication operation(s), in accordance with one or more embodiments.

In the depicted fabrication stages, a lower ILD may be formed and backside contacts may be formed therein. Further in the depicted fabrication stages, a backside BEOL network may be formed.

For example, a backside contact ILD 210 may be formed upon the respective exposed backside surfaces of the STI regions 130, the upper S/D region backside contact 206, the lower S/D region backside contact 208, and the ILD fill 160. The backside contact ILD 210 may be formed by depositing a dielectric material, such as, for example, porous silicates, carbon doped oxides, silicon dioxides, silicon nitrides, silicon oxynitrides, or other dielectric materials. Any appropriate deposition technique for forming the backside contact ILD 210 can be utilized. The backside contact ILD 210 can be formed using, for example, CVD, PECVD, ALD, flowable CVD, spin-on dielectrics, or PVD.

Subsequently, backside vertical interconnect access (VIA) or VIAs 212, 214 may be formed by patterning respective backside contact openings within the backside contact ILD 210 from the backside (i.e., from below the semiconductor IC device 100, as depicted, upward to respective structures thereof). The backside VIAs 212, 214 may be in direct or indirect physical and electrical contact and/or may physically meld with respective material(s) of one or more regions of the semiconductor IC device 100. For example, a particular backside VIA 212 may be in direct contact with the upper S/D region backside contact 206 and a particular backside VIA 212 may be in direct contact with the lower S/D region backside contact 208.

The backside VIAs 212, 214 may be formed by depositing conductive material(s) like the processes utilized to fabricate the upper S/D region backside contact 206 and the lower S/D region backside contact 208. Subsequently, a CMP or other planarization process may planarize the respective bottom surfaces of backside VIAs 212, 214 and the backside contact ILD 210. In embodiments, the backside VIAs 212, 214 are fabricated in backside MOL fabrication operations and may be illustrations of MOL backside contacts. In other embodiments, as depicted, the backside VIAs 212, 214 are VIA interconnects within a lowest VIA level within the backside BEOL network 220.

Further in the depicted fabrication stage, a backside BEOL network 220 may be formed. The backside BEOL network 220 may be formed over the backside ILD 210, over one or more backside VIAs 212, 214, or the like. The backside BEOL network 220 may be indirectly electrically and/or indirectly physically connected to the one or more S/D regions (e.g., upper S/D region(s) 192, lower S/D region(s) 141, etc.) by way of a particular backside contact or series of backside contacts.

The backside BEOL network 220 can include one or more interconnect dielectric material layers (including one of the dielectric materials mentioned above for backside contact ILD 210) and contains backside conductive wires and/or interconnects, such as VIAs, embedded therein. In some embodiments, the backside wires within the backside BEOL network 220 may be composed of Cu. The backside BEOL network 220 can include "x" numbers of backside metal levels, wherein "x" is an integer starting from 1. If not included in frontside BEOL network 196, backside BEOL network 220 may further contain conductive pads that are connected to one or more of the backside metal wires and may be used to connect the semiconductor IC device 100 to the external and/or higher-level structure.

In an example, signal routing and power routing is effectively split between the frontside BEOL network 196 and the backside BEOL network 220. For example, at least 90% of the frontside metal wires (e.g., furthest from the transistor(s)) are signal routing metal wires and the remainder frontside metal wires which are usually present in metal levels closest to the transistor, can be used as power routing wires. Further in this example, at least 90% of the backside metal wires that are in metal levels closest to the transistor(s) are power routing metal wires and the remainder backside metal wires which are usually present in metal levels furthest away from the transistor, can be used as signal routing wires. Power routing wires may be less dense signal routing wires. A signal routing wire is defined herein as a conductive feature, such as a wire, trace, or the like, that is configured to electrically carry a functional or logical potential or signal that is to change or is otherwise dynamic over time. A power routing wire is defined herein as a conductive feature, such as a wire, trace, plane, or the like, that is configured to electrically carry power potential. For example, a power routing wire carries or otherwise has a functional power potential, such as VDD, VSS, or the like. For clarity, in some examples, the backside BEOL network 220 may be a backside power distribution network (BSPDN).

The backside BEOL network 220 includes various wiring levels. The wiring levels may alternate between a VIA level and a metal level. To form a VIA level, an associated dielectric passivation layer may be formed, the dielectric passivation layer may be patterned to create a VIA opening therein, and conductive or metal material may be deposited within the VIA opening to form a via contact. A VIA within a lowest via level within the backside BEOL network 220 may connect either directly or indirectly to a backside VIA 212, 214, respectively.

To form a metal level, an associated dielectric passivation layer may be formed, the dielectric passivation layer may be patterned to create a wiring trench therein, and conductive or metal material may be deposited within the wiring trench to form a wire. A wire, such as within a lowest wire level may connect directly to one or more backside VIAs 212, 214.

FIG. 18 depicts a flow diagram illustrating a method 300 to fabricate a semiconductor IC device, such as semiconductor IC device 100. The depicted fabrication operations of method 300 may be illustratively depicted and described above with reference to one or more of FIG. 2 through FIG. 17 of the drawings, which describe the fabrication of semiconductor IC device 100, though various fabrication operations described in method 300 may be used to fabricate other types of semiconductor IC devices, such as semiconductor IC devices 400, 500, 600, depicted in FIG. 19 through FIG. 21, respectively. The method 300 depicted herein is illustrative. There can be many variations to the diagram or operations described therein without departing from the spirit of the embodiments. For instance, the operations can be performed in a differing order, or operations can be added, deleted, or modified.

At block 302, method 300 may begin with forming a lower transistor that includes at least one or more lower S/D region(s) and a bottom S/D region contact placeholder underneath a respective lower S/D region.

At block 304, method 300 may continue with forming a lower interlayer dielectric (ILD) that consists of at least a first dielectric material and with forming one or more upper S/D region cut opening(s) within the lower ILD to partially expose a portion of an associated S/D region(s).

At block 306, method 300 may continue with horizontally or laterally indenting the associated S/D region(s).

At block 308, method 300 may continue with depositing an ILD fill within the one or more upper S/D region cut opening(s) against the associated S/D region(s).

At block 310, method 300 may continue with forming an upper active region and upper sacrificial gate structures that are associated with an upper transistor.

At block 312, method 300 may continue with forming one or more upper transistor backside contact placeholder opening(s) by a self-aligned etch or removal of the second dielectric material selective to the first dielectric material. Further, at block 312, method 300 may continue with forming an upper transistor backside contact placeholder 190 within respective one or more upper transistor backside contact placeholder opening(s).

At block 314, method 300 may continue with forming one or more frontside contact(s) and with forming a frontside back end of line (BEOL) network.

At block 316, method 300 may continue with removing the one or more lower S/D contact placeholders and with removing the one or more upper S/D contact placeholders.

At block 318, method 300 may continue with forming one or more lower S/D contact(s) in place of the removed one or more lower S/D contact placeholders and with forming one or more upper S/D contact(s) in place of the removed one or more upper S/D contact placeholders.

FIG. 19 depicts a fabrication structure cross-section view of respective illustrative semiconductor IC device 400 that includes upper transistor backside contact 206 that is electrically connected with S/D region 192 of an upper transistor. Semiconductor IC device 400 differs from semiconductor IC device 100 in that the lower S/D region 141 is connected to a frontside contact 195 as opposed to a backside contact. In this example, the lower S/D region backside contact placeholder(s) 140 may be retained underneath the lower S/D region 141 in such lower S/D region 141 instances that utilize a frontside contact 195. The frontside contact 195 may be fabricated by the frontside contact fabrication stages discussed herein and may be further directly connected and/or electrically connected to the frontside BEOL network 196.

FIG. 20 depicts a fabrication structure cross-section view of respective illustrative semiconductor IC device 500 that includes upper transistor backside contact 206 that is electrically connected with S/D region 192 of an upper transistor. Semiconductor IC device 500 differs from semiconductor IC device 100 in that a top portion of the upper transistor backside contact placeholder 190 of semiconductor IC device 500 is etched and trench epi region 191 is formed therein, prior to the formation of the upper S/D region 192.

Figure 21:
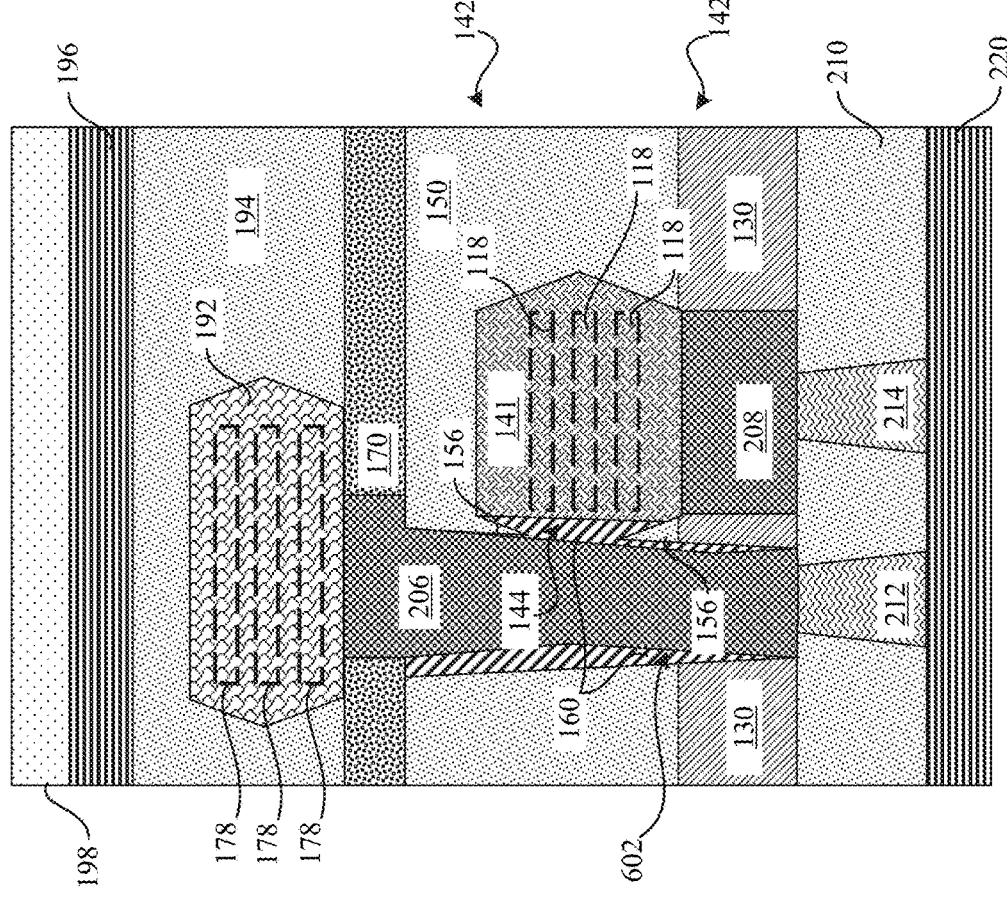

FIG. 21 depicts a fabrication structure cross-section view of respective illustrative semiconductor IC device 600 that includes upper transistor backside contact 206 that is electrically connected with S/D region 192 of an upper transistor. Semiconductor IC device 600 differs from semiconductor IC device 100 in that portion(s) of the ILD fill 160 are further removed from the backside of the semiconductor IC device 600 (e.g., by a self-aligned etch that targets removal of ILD fill 160 selective to STI region(s) 130) prior to formation of the upper transistor backside contact 206. This may be beneficial to increase the bottom surface area of the upper transistor backside contact 206 to promote alignment and landing of such upper transistor backside contact 206 with backside VIAs 212. In this example, upper transistor backside contact 206 may have inwardly sloped sidewall(s) 602, with reference to the backside of the semiconductor IC device 600, that are formed because of the backside etch of the ILD fill 160, in addition to the otherwise oppositely orientated inwardly sloped sidewall(s). These oppositely orientated inwardly sloped sidewall(s), with reference to the frontside of the semiconductor IC device 100, 600, are characteristically formed because of the frontside self-aligned etch of the ILD fill 160.

Semiconductor IC devices 100, 400, 500, 600 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher-level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor integrated circuit (IC) device comprising:
   an upper transistor comprising upper source/drain (S/D) region that is connected to a backside contact;
   a lower transistor comprising a lower S/D region with a recessed sidewall; and
   a dielectric contact liner in direct contact with the recessed sidewall of the lower S/D region and with a sidewall of the backside contact.

2. The semiconductor IC device of claim 1, wherein the backside contact is further electrically connected to a backside back end of line (BEOL) network.

3. The semiconductor IC device of claim 1, further comprising:
   a bonding layer between the upper transistor and the lower transistor.

4. The semiconductor IC device of claim 1, wherein the lower S/D region is inset with respect to the upper S/D region.

5. The semiconductor IC device of claim 1, wherein the recessed sidewall of the lower S/D region is substantially vertical.

6. The semiconductor IC device of claim 1, wherein the recessed sidewall of the lower S/D region is substantially parallel with the sidewall of the backside contact.

7. The semiconductor IC device of claim 1, wherein the lower S/D region further comprises one or more (111) crystallographic side surfaces that face away from the backside contact.

8. The semiconductor IC device of claim 1, wherein the lower transistor further comprises a lower interlayer dielectric (ILD) around the lower S/D region.

9. The semiconductor IC device of claim 8, wherein the dielectric contact liner is composed of a first material and the lower ILD is composed of a second material and wherein the first material has etch selectivity relative to the second material.

10. The semiconductor IC device of claim 3, wherein the backside contact comprises an upper portion and a lower portion and wherein the upper portion has a larger perimeter relative to a perimeter of the lower portion.

11. The semiconductor IC device of claim 3, wherein respective upper and lower surfaces of the upper portion are coplanar with respective upper and lower surfaces of the bonding layer.

12. The semiconductor IC device of claim 1, wherein the lower S/D region is electrically connected to a frontside BEOL network by a frontside contact.

13. A semiconductor integrated circuit (IC) device comprising:
  an upper transistor comprising upper source/drain (S/D) region that is connected to a first backside contact;
  a lower transistor comprising a lower S/D region that has a recessed sidewall and is connected to a second backside contact; and
  a dielectric contact liner in direct contact with the recessed sidewall of the lower S/D region and with a sidewall of the first backside contact, wherein at least a portion of the upper S/D region overlaps the lower S/D region there below.

14. The semiconductor IC device of claim 13, wherein both the first backside contact and the second backside contact are further connected to a backside back end of line (BEOL) network.

15. The semiconductor IC device of claim 13, further comprising:
  a bonding layer between the upper transistor and the lower transistor.

16. The semiconductor IC device of claim 13, wherein the recessed sidewall of the lower S/D region is substantially vertical.

17. The semiconductor IC device of claim 13, wherein the recessed sidewall of the lower S/D region is substantially parallel with the sidewall of the first backside contact.

18. The semiconductor IC device of claim 13, wherein the lower S/D region further comprises one or more (111) crystallographic side surfaces that face away from the first backside contact.

19. The semiconductor IC device of claim 13, wherein the lower transistor further comprises a lower interlayer dielectric (ILD) around the lower S/D region, wherein the dielectric contact liner is composed of a first material and the lower ILD is composed of a second material, and wherein the first material has etch selectivity relative to the second material.

20. A method of fabricating a semiconductor integrated circuit (IC) device comprising:
  forming a lower source/drain (S/D) region of a lower transistor;
  depositing an interlayer dielectric (ILD) composed of a first dielectric material around the lower S/D region;
  forming an upper S/D region backside contact opening within the ILD, wherein the upper S/D region backside contact opening exposes a side portion of the lower S/D region;
  recessing the side portion of the lower S/D region;
  forming an upper S/D region backside contact placeholder within the upper S/D region backside contact opening against the recessed side portion of the lower S/D region.

* * * * *